US009251923B2

(12) United States Patent
Kato et al.

(10) Patent No.: US 9,251,923 B2
(45) Date of Patent: *Feb. 2, 2016

(54) VARNISH CONTAINING GOOD SOLVENT AND POOR SOLVENT

(75) Inventors: Taku Kato, Funabashi (JP); Takuji Yoshimoto, Funabashi (JP); Go Ono, Funabashi (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 1147 days.

This patent is subject to a terminal disclaimer.

(21) Appl. No.: 11/579,066

(22) PCT Filed: Apr. 28, 2005

(86) PCT No.: PCT/JP2005/008118
§ 371 (c)(1),
(2), (4) Date: Oct. 27, 2006

(87) PCT Pub. No.: WO2005/107335
PCT Pub. Date: Nov. 10, 2005

(65) Prior Publication Data
US 2007/0205400 A1 Sep. 6, 2007

(30) Foreign Application Priority Data
Apr. 30, 2004 (JP) ................................. 2004-135572

(51) Int. Cl.
*C08G 73/00* (2006.01)
*H01B 1/12* (2006.01)
*C08G 73/02* (2006.01)
*C08G 73/08* (2006.01)
*C08G 73/18* (2006.01)
*C08G 73/22* (2006.01)
*C09D 165/00* (2006.01)
*C09D 179/02* (2006.01)
*C09D 179/04* (2006.01)
*C09D 179/06* (2006.01)
*H01L 51/00* (2006.01)
*H01L 51/50* (2006.01)

(52) U.S. Cl.
CPC ............ *H01B 1/122* (2013.01); *C08G 73/0266* (2013.01); *C08G 73/08* (2013.01); *C08G 73/18* (2013.01); *C08G 73/22* (2013.01); *C09D 165/00* (2013.01); *C09D 179/02* (2013.01); *C09D 179/04* (2013.01); *C09D 179/06* (2013.01); *H01L 51/0007* (2013.01); *H01L 51/5052* (2013.01)

(58) Field of Classification Search
USPC .............................. 252/500; 257/40; 428/411.1
See application file for complete search history.

(56) References Cited

U.S. PATENT DOCUMENTS

| 5,264,552 | A | 11/1993 | Abe et al. |
|---|---|---|---|
| 5,536,588 | A | 7/1996 | Naito |
| 5,811,834 | A * | 9/1998 | Tamano et al. ................. 257/40 |
| 5,958,637 | A * | 9/1999 | Morishita et al. .......... 430/58.45 |
| 5,981,695 | A | 11/1999 | Mattes et al. |
| 5,993,694 | A | 11/1999 | Ito et al. |
| 6,160,177 | A | 12/2000 | MacDiarmid et al. |
| 6,235,871 | B1 | 5/2001 | Singer et al. |
| 6,358,437 | B1 | 3/2002 | Jonas et al. |
| 6,582,504 | B1 | 6/2003 | Fujita |
| 6,630,567 | B1 | 10/2003 | Palaniappan et al. |
| 6,720,029 | B2 | 4/2004 | Fujita et al. |
| 7,048,874 | B2 | 5/2006 | Louwet et al. |
| 7,341,678 | B2 | 3/2008 | Kato et al. |
| 8,575,392 | B2 | 11/2013 | Yoshimoto et al. |
| 2001/0003602 | A1 | 6/2001 | Fujita |
| 2004/0144975 | A1 | 7/2004 | Seki et al. |
| 2005/0082514 | A1 | 4/2005 | Yoshimoto et al. |
| 2006/0115652 | A1 | 6/2006 | Yoshimoto et al. |
| 2006/0225611 | A1 | 10/2006 | Kato et al. |
| 2007/0043222 | A1 | 2/2007 | Yoshimoto et al. |
| 2012/0263867 | A1 | 10/2012 | Kanbe et al. |

FOREIGN PATENT DOCUMENTS

| EP | 0361429 | A2 | 4/1990 |
|---|---|---|---|
| EP | 0982974 | A1 | 3/2000 |
| EP | 1083775 | A1 | 3/2001 |
| EP | 1156072 | A1 | 11/2001 |
| EP | 1417993 | A1 | 11/2004 |
| EP | 1477993 | A1 | 11/2004 |
| EP | 1589788 | A1 | 10/2005 |
| EP | 1638372 | A | 3/2006 |
| EP | 1640372 | A1 | 3/2006 |

(Continued)

OTHER PUBLICATIONS

Miyoko Ochi et al., Bulletin of Chemical Society of Japan, 67, pp. 1749-1752 (1994).
W. J. Zhang et al., Synthetic Metals, USA, 84, pp. 119-120 (1997).
Juzo Nakayama et al., Heterocycles, vol. 26, No. 4, pp. 939-942, (1987).
Juzo Nakayama et al., Hetercycles, vol. 26, No. 7, pp. 1793-1796, (1987).

(Continued)

*Primary Examiner* — Monique Peets
(74) *Attorney, Agent, or Firm* — Birch, Stewart, Kolasch & Birch, LLP

(57) ABSTRACT

A varnish comprising a ground substance consisting of a polymer or oligomer of 200 to 50'104 molecular weight or organic compound of 200 to 1000 molecular weight and a solvent containing a good solvent and a poor solvent whose boiling point (under 760 mmHg) is at least 20° C. lower than that of the good solvent, wherein the ground substance is dissolved in the solvent. Any thin film prepared from this varnish is substantially from generation of foreign matter, so that it can appropriately be used as thin films for electronic devices and those for use in other technical fields.

14 Claims, 4 Drawing Sheets

(56) References Cited

FOREIGN PATENT DOCUMENTS

| | | |
|---|---|---|
| JP | 3-28229 A | 2/1991 |
| JP | 4-304465 A | 10/1992 |
| JP | 6-32878 A | 2/1994 |
| JP | 6-122277 A | 5/1994 |
| JP | 2000-106278 A | 4/2000 |
| JP | 2000-204158 A | 7/2000 |
| JP | 2001-52861 A | 2/2001 |
| JP | 2001-155861 A | 6/2001 |
| JP | 2001-167878 A | 6/2001 |
| JP | 2002-500408 A | 1/2002 |
| JP | 2002-151272 A | 5/2002 |
| JP | 2004-95406 A | 3/2004 |
| JP | 2004-127897 A | 4/2004 |
| JP | WO2004/043117 * | 5/2004 |
| JP | 2005-108628 A | 4/2005 |
| WO | WO 99/34371 A1 | 7/1999 |
| WO | WO 99/28290 A1 | 10/1999 |
| WO | WO-00/59267 A1 | 10/2000 |
| WO | WO03/071559 * | 8/2003 ............ 252/500 |
| WO | WO-03/071559 A1 | 8/2003 |
| WO | WO-03/080708 A1 | 10/2003 |
| WO | WO-2004/105446 A1 | 12/2004 |

OTHER PUBLICATIONS

International Search Report issued Sep. 4, 2009, in EP 05736641.1.
U.S. Advisory Action, dated Jan. 5, 2010, for U.S. Appl. No. 10/534,042.
U.S. Office Action, dated Aug. 21, 2009, for U.S. Appl. No. 10/534,042.
U.S. Office Action dated May 21, 2014 for U.S. Appl. No. 10/534,042.
Bharathan et al., "Polymer electroluminescent devices processed by inkjet printing: I. Polymer light-emitting logo", Applied Physics Letters, vol. 72. No. 21, May 25, 1998, p. 2660-2662.
English translation of JP-2002-151272-A dated May 24, 2002.
Flick, "Industrial Solvents Handbook", Noyes Data Corporation, 1998, p. 1-4.
Ganzorig et al., "A Lithium Carboxylate Ultrathin Film on an Aluminum Cathode for Enhanced Electron Injection in Organic Electroluminescent Devices", Japanese Journal of Applied Physics, vol. 38, Nov. 15, 1999, p. L1348-L1350.
Gustafsson et al., "Flexible light-emitting diodes made from soluble conducting polymers", Nature, vol. 357, Jun. 11, 1992, p. 477-479.
Hung et al. "Enhanced electron injection in organic electroluminescence devices using an Al/LiF electrode", Applied Physics Letters, vol. 70, No. 2, Jan. 13, 1997, p. 152-154.
Japanese Office Action dated Jun. 16, 2010, for Japanese Application No. 2004-549623.
Supplementary European Search Report dated Jan. 7, 2010, for Application No. 03810626.6.
U.S. Office Action dated Apr. 29, 2008, for U.S. Appl. No. 10/534,042.
U.S. Office Action dated Oct. 17, 2008, for U.S. Appl. No. 10/534,042.
Van Slyke et al., "Organic electroluminescent device with improved stability", Applied Physics Letters, vol. 69, No. 15, Oct. 7, 1996, p. 2160-2162.
Wakimoto et al., "Organic EL Cells Using Alkaline Metal Compunds as Electron Injection Materials", IEEE Transactions on Electron Devices, vol. 44, No. 8, Aug. 1997, p. 1245-1248.
Yang et al., "Polyaniline as a transparent electrode for polymer light-emitting diodes: Lower operating voltage and higher efficiency", Applied Physics Letters, vol. 64, No. 10, Mar. 7, 1994, p. 1245-1247.
Zhang et al., "Synthesis of Oligomeric Anilines", Synthetic Metals, vol. 84, 1997, p. 119-120.
Final Office Action issued Jan. 7, 2015, in U.S. Appl. No. 10/534,042.

* cited by examiner

VARNISH CONTAINING GOOD SOLVENT AND POOR SOLVENT

TECHNICAL FIELD

This invention relates to a varnish including a good solvent and a poor solvent.

BACKGROUND ART

When an organic compound, especially a polymer or oligomer is used as an electronic device material, it is often used as thin films. Illustrative are insulating films, charge-transporting films, protecting films, and leveling films.

In organic electroluminescence (hereinafter abbreviated as "EL") devices, charge-transporting thin films made of a polymer or oligomer or the like are used as hole transport layers (buffer layers) and/or charge injection layers (see, for example, Patent Document 1).

A charge-transporting thin film is required to be a uniform, roughness-free thin film. Roughness of a thin film induces the occurrence of dark spots and reductions in device characteristics due to short circuiting between an anode and a cathode. Such roughness, therefore, becomes a cause of a reduction in yield upon fabrication of organic EL devices. This roughness is considered to arise by coagulation of a material, and is considered to be attributable to a reduction in the uniformity of a thin film as a result of a localized rise or sink of the thin film.

Very small particles may also occur in a thin film in some instances. The occurrence of these particles is also considered to be attributable to the coagulation of its material. Those of this material as coagulated in the form of very fine particles are called "contamination particles". The occurrence of contamination particles also gives devices such deleterious effects as mentioned above. The thickness of an organic layer in a general organic EL device is as small as from 200 to 1,000 nm, so that the existence of contamination articles becomes a direct cause of electric short circuiting between an anode and a cathode and is a serious problem for the device.

To solve the problem of contamination particles, it may be contemplated to replace a material, which is to be used, by another material. However, such a replacement is unable to obtain sufficient device characteristics in many instances, and requires numerous trials and errors for the selection of a material.

This problem of contamination particles is serious not only in thin films for electronic devices but also in other technical fields that use thin films.

For these reasons, there is an outstanding desire for the development of thin films free of contamination particles and also their fabrication method.

Patent Document 1:
Japanese Patent Laid-open No. 2002-151272

DISCLOSURE OF THE INVENTION

Problems to be Solved by the Invention

The present invention has been completed with such circumstances in view, and has as objects thereof the provision of a varnish suitable usable for thin films in electronic devices and thin films in other technical fields, a thin film substantially free of contamination particles, and its fabrication method.

A further object of the present invention is to provide, as an electronic device application, an organic EL device provided with a charge-transporting thin film substantially free of contamination particles.

Means for Solving the Problems

To achieve the above-described problems, the present inventors have proceeded with an extensive investigation on solvent compositions which have heretofore been unstudied as a method for the provision of a uniform thin film free of contamination particles. As a result, it has been surprisingly found that the occurrence of contamination particles can be significantly inhibited by relying upon the composition of a solvent for a varnish, resulting in the finding of a varnish which can provide thin films substantially free of contamination particles.

Specifically, the present inventors have found that a combination of a good solvent and a poor solvent, which has a boiling point lower by at least 20° C. than the good solvent under 760 mmHg, can effectively inhibit the occurrence of contamination particles in a thin film, leading to the completion of the present invention.

There is accordingly provided an invention as described below under [1] to [16].

[1] A varnish including: a ground substance composed of an organic compound having a molecular weight of from 200 to 1,000 or an oligomer or polymer having a molecular weight of from 200 to 500,000; and a solvent including a good solvent and a poor solvent having a boiling point lower by at least 20° C. than the good solvent under 760 mmHg, wherein the ground substance is dissolved in the solvent.

[2] The charge-transporting varnish as described above in [1], wherein the ground substance is a charge-transporting substance composed of a charge-transporting monomer or a charge transporting oligomer or polymer having a number average molecular weight of from 200 to 500,000; or a charge transporting organic material composed of the charge transporting substance and an electron-accepting dopant substance or hole-accepting dopant substance.

[3] The charge-transporting varnish as described above in [2], wherein the charge-transporting substance is a charge-transporting monomer having a conjugate unit, or a charge-transporting oligomer having conjugate units and a number average molecular weight of from 200 to 5,000, said conjugate units being of the same kind and being arranged successively or being of at least two different kinds and being arranged successively in an arbitrary order.

[4] The charge-transporting varnish as described above in [3], wherein the conjugate unit or units is a conjugate unit or units of at least one kind selected from substituted or unsubstituted, di- to tetra-valent, aniline, thiophene, dithiin, furan, pyrrole, ethynylene, vinylene, phenylene, naphthalene, anthracene, imidazole, oxazole, oxadiazole, quinoline, quinoxaline, silole, silicon, pyridine, pyrimidine, pyrazine, phenylenevinylene, fluorene, carbazole, triarylamine, metal- or nonmetal-phthalocyanine, and metal- or non-metal-porphyrin units.

[5] The charge-transporting varnish as described above in [3], wherein the charge-transporting substance is an oligoaniline derivative represented by the following formula (1) or a quinonediimine derivative as an oxidation product of the formula (1):

[Chemical Formula 1]

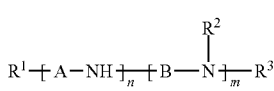
(1)

wherein $R^1$, $R^2$ and $R^3$ each independently represents a hydrogen atom, halogen atom, a hydroxyl, amino, silanol, thiol, carboxyl, sulfonic acid, phosphoric acid, phosphate ester, ester, thioester, amido, nitro, monovalent hydrocarbon, organoxy, organoamino, organosilyl, organothio, acyl or sulfone group, and A and B each independently represents a divalent group represented by the following formula (2) or (3):

[Chemical Formula 2]

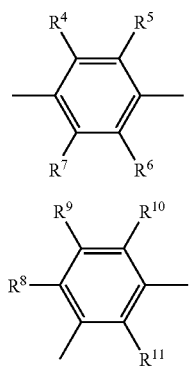
(2)

(3)

wherein $R^4$ to $R^{11}$ each independently represents a hydrogen atom, halogen atom, a hydroxyl, amino, silanol, thiol, carboxyl, sulfonic acid, phosphoric acid, phosphate ester, ester, thioester, amido, nitro, monovalent hydrocarbon, organoxy, organoamino, arganosilyl, organothio, acyl or sulfone group, and m and n are each independently an integer of at least 1 and satisfy m+n≤20.

[6] The charge-transporting varnish as described above in [5], wherein the charge-transporting substance is an oligoaniline derivative represented by the following formula (4) or a quinonediimine derivative as an oxidation product of the formula (4):

[Chemical Formula 3]

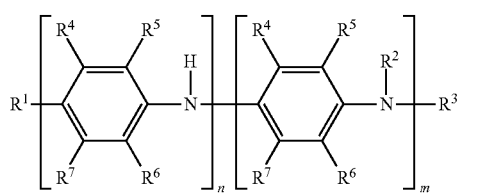
(4)

wherein $R^1$ to $R^7$, m and n have the same meanings as defined above.

[7] The charge-transporting varnish as described above in any one of [2] to [6], wherein the electron-accepting dopant substance is a sulfonic acid derivative represented by the following formula (5):

[Chemical Formula 4]

(5)

wherein D represents a benzene, naphthalene, anthracene or phenanthrene ring or a heterocycle, and $R^{12}$ and $R^{13}$ each independently represents a carboxyl or hydroxyl group.

[8] The charge-transporting varnish as described above in any one of [2] to [6], wherein the electron-accepting dopant substance is a sulfonic acid derivative represented by the following formula (6):

[Chemical Formula 5]

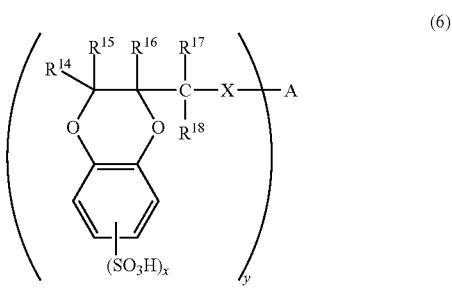
(6)

wherein $R^{14}$ to $R^{18}$ each independently represents a hydrogen atom, a substituted or unsubstituted, monovalent hydroxyl group, or a halogen atom, X represents a single bond, O, S or NH, A represents a hydrogen or halogen atom, O, S, S(O) group, S(O$_2$) group, N with one or more substituted or unsubstituted groups bonded thereon, Si, P, P(O) group, or a mono- or higher valent, substituted or unsubstituted hydrocarbon group, y is an integer equal to a valence number of A and satisfies 1≤y, and x represents a number of sulfonic acid group(s) bonded on a benzene ring moiety in a 1,4-benzodioxane skeleton and satisfies 1≤x≤4.

[9] A thin film fabricated using the varnish as described above in [1].

[10] A charge-transporting thin film fabricated using the charge-transporting varnish as described above in any one of [2] to [8].

[1,1] The charge-transporting thin film as described above in [10], wherein the charge-transporting thin film has been fabricated from a charge-transporting varnish having a solid content of 1.0%, and the charge-transporting thin film has a number of defects not greater than 100 when measured at a film thickness of 30 nm by "Surfscan™ 6220", a surface particle inspection system manufactured by KLA-Tencor Corporation, under such conditions as permitting detection of contamination particles of down to 0.5 μm at a capture rate of 80%.

[12] An organic electroluminescence device including the charge-transporting thin film as described above in [10] or [11].

[13] The organic electroluminescence device as described above in [12], wherein the charge-transporting thin film is a hole injection layer or hole transport layer.

[14] A method for the fabrication of a thin film, which includes using a varnish as described above in [1].

[15] The method for the fabrication of a charge-transporting thin film, which includes using the charge-transporting varnish as described above in any one of [2] to [8].

[16] A charge-transporting thin film fabricated from a charge-transporting varnish having a solid content of 1.0%, and having a number of defects not greater than 100 when measured at a film thickness of 30 nm by "Surfscan™ 6220", a surface particle inspection system manufactured by KLA-Tencor Corporation, under such conditions as permitting detection of contamination particles of down to 0.5 µm at a capture rate of 80%.

Effects of the Invention

The use of the varnish according to the present invention makes it possible to obtain, with good reproducibility, thin films having high levelness and uniformity and significantly inhibited in the occurrence of contamination particles.

This has been substantiated through the quantitation conducted by the present inventors on contamination particles in charge-transporting thin films for organic EL devices. The assessment of contamination particles in a charge-transporting thin film in the past was limited to an observation of only a part of a substrate by a visual observation under a microscope, the visual observation tending to develop differences among individuals, or by an atomic force microscope (AFM), an electron microscope (SEM) or the like, and therefore, can be hardly considered to have quantitatively assessed contamination particles in the whole substrate and was poor in objectivity. As a matter of fact, upon fabricating organic EL devices by using charge-transporting thin films, the occurrence of many contamination particles in the whole substrates leads to a reduction in fabrication yield and hence, to a significant reduction in fabrication efficiency even if the occurrence of contamination particles in parts of the substrates is little.

To semi-quantitatively assess the occurrence of contamination particles in large-area substrates, the present inventors conducted quantitation of contamination particles by using "Surfscan™ 6220", a surface particle inspection system manufactured by KLA-Tencor Corporation. By that measurement, thin films obtained from each varnish according to the present invention were each confirmed to be a film having high levelness and uniformity and significantly inhibited in the occurrence of contamination particles.

The varnish according to the present invention can be readily prepared using a water-free, organic solvent. This varnish can be formed into films by various wet processes such as spin coating process, inkjet process and spraying process, and can form thin films on substrates at low cost and high yield.

As a coating process of the charge-transporting varnish useful for organic EL devices, printing process or spraying process has higher feasibility as an industrial process than spin coating process from the standpoint of the yield and fabrication efficiency of devices. The charge-transporting varnish according to the present invention is suited for such industrial processes, and can obtain high-reliability, charge-transporting thin films with good reproducibility.

Further, the charge-transporting thin film with contamination particles contained at extremely low level exhibits superb electrical short-circuit prevention effect when employed in an organic EL device. This effect is particularly valuable in the case of a passive matrix in an organic EL device, because a passive matrix is in such a mode as developing, for an electrical short circuit caused by contamination particles, a visible defect that a single image display line is wholly altered in luminance characteristics.

The charge-transporting thin film obtained by using the charge-transporting varnish according to the present invention avoids an electrical short circuit which would otherwise occur due to contamination particles from the outside, and also contains contamination particles at very low level in the thin film itself. The charge-transporting thin film, therefore, very hardly develops an electrical short circuit. Accordingly, the present invention obviously exhibits advantageous effects in the fabrication of not only passive matrixes but also active matrixes. Moreover, the use of charge-transporting thin films according to the present invention makes it possible to stably fabricate devices at high yield and fabrication efficiency in the industrialization of organic EL devices.

The charge-transporting thin film according to the present invention, when employed as a hole injection layer or hole transport layer in an EL device, can be as a thin film excellent in levelness and uniformity compared with the charge-transporting thin films in the past, thereby making it possible to significantly reduce short-circuiting between ITO electrodes which would be induced by the roughness of the ITO electrodes or contamination particles existing on the electrodes.

Therefore, the use of the charge-transporting varnish according to the present invention can achieve a reduction in light-emission initiating voltage, an improvement in current efficiency and an increase in device life, and can fabricate economical EL devices of high fabrication efficiency at high yield.

Charge-transporting thin films obtainable from the charge-transporting varnish according to the present invention can be formed by applying the varnish to diverse substrates by various coating processes, and therefore, are useful in their applications as organic films for use in capacitor-electrode protecting films, antistatic films, gas sensors, temperature sensors, humidity sensors, pressure sensors, light sensors, radiation sensors, ion sensors, biosensors, and field emission transistor sensors; as organic films for use in primary cells, secondary cells, fuel cells, solar cells and polymer cells; and as organic films for use in electromagnetic shielding films, UV absorbing films, gas barrier films, optical information storage media, and integrated optics.

BEST MODES FOR CARRYING OUT THE INVENTION

Figure 1:
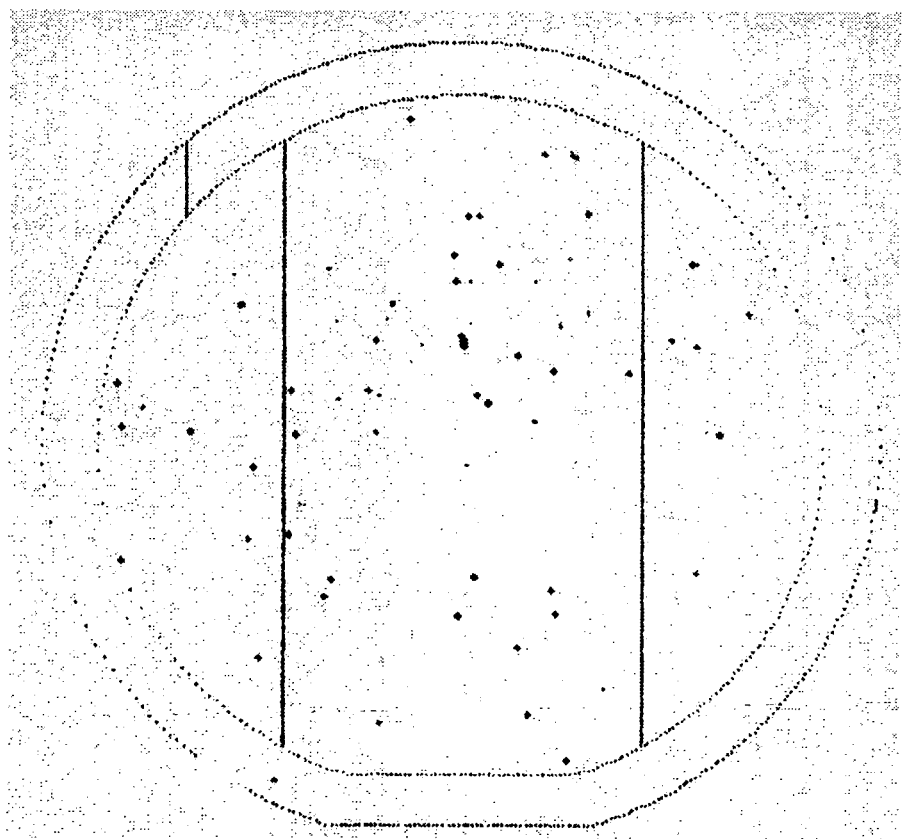
FIG. 1 is a diagram illustrating the results of an inspection and measurement of surface contamination particles on a charge-transporting thin film obtained by applying a varnish of Example 1 on a silicon wafer and baking the same.

The present invention will hereinafter be described in further detail.

The varnish according to the present invention contains a ground substance and a solvent. The ground substance is composed of an organic compound having a molecular weight of from 200 to 1,000 or an oligomer or polymer having a molecular weight of from 200 to 500,000, while the solvent includes a good solvent and a poor solvent having a boiling point lower by at least 20° C. than the good solvent under 760 mmHg. The ground substance is dissolved in the solvent.

The varnish is a charge-transporting varnish when in the varnish, the ground substance is a charge-transporting substance composed of a charge-transporting monomer or a charge transporting oligomer or polymer having a number average molecular weight of from 200 to 500,000 or a charge transporting organic material composed of the charge transporting substance and an electron-accepting dopant substance or hole-accepting dopant substance.

The term "charge-transporting" as used herein is synonymous with "electrically conductive", and means one of "hole-transporting", "electron-transporting", or "bipolar-charge-transporting" for holes and electrons. The charge-transporting varnish according to the present invention can be either one having charge-transporting property by itself or one the use of which can provide a solid film equipped with charge-transporting property.

No particular limitation is imposed on the preparation method of the charge-transporting varnish. In general, it can be prepared by mixing the individual materials together.

No particular limitation is imposed on the organic compound, oligomer or polymer for use in the present invention, insofar as it is soluble in the solvent.

No particular limitation is imposed either on the charge-transporting monomer, charge-transporting oligomer or polymer for use in the present invention, insofar as it is soluble in the solvent. Nonetheless, desired is one having a structure that at least one kind of conjugate units are arranged successively.

A "conjugate unit" can be an atom, aromatic ring or conjugate group that can transport charges, and no particular limitation is imposed thereon. Preferred examples include substituted or unsubstituted, di- to tetra-valent, aniline, thiophene, furan, pyrrole, ethynylene, vinylene, phenylene, naphthalene, oxadiazole, quinoline, silole, silicon, pyridine, phenylenevinylene, fluorene, carbazole, triarylamine, metal- or nonmetal-phthalocyanine, and metal- or non-metal-porphyrin groups.

Specific examples of substituents on the above-described conjugate units independently include hydrogen atoms, halogen atoms, hydroxyl, amino, silanol, thiol, carboxyl, sulfonic acid, phosphoric acid, phosphate ester, ester, thioester, amido, nitro, monovalent hydrocarbon, organoxy, organoamino, organosilyl, organothio, acyl and sulfone groups. These functional groups may be substituted further by any one or more of such functional groups.

As specific examples of the monovalent hydrocarbon group, it is possible to exemplify alkyl groups such as methyl, ethyl, propyl, butyl, t-butyl, hexyl, octyl and decyl; cycloalkyl groups such as cyclopentyl and cyclohexyl; bicycloalkyl groups such as bicyclohexyl; alkenyl groups such as vinyl, 1-propenyl, 2-propenyl, isopropenyl, 1-methyl-2-propenyl, 1-, 2- or 3-butenyl and hexenyl; aryl groups such as phenyl, xylyl, tolyl, biphenyl and naphthyl; aralkyl groups such as benzyl, phenylethyl and phenylcyclohexyl; and those obtained by substituting some or all of the hydrogen atoms of these monovalent hydrocarbon groups with like numbers of halogen atoms, hydroxyl groups, alkoxy groups and/or the like.

Specific examples of the organoxy group include alkoxy, alkenyloxy, and aryloxy groups. As their alkyl, alkenyl and aryl groups, those similar to the above-exemplified can be mentioned.

Specific examples of the organoamino group include phenylamino; alkylamino groups such as methylamino, ethylamino, propylamino, butylamino, pentylamino, hexylamino, heptylamino, octylamino, nonylamino, decylamino and laurylamino; dialkylamino groups such as dimethylamino, diethylamino, dipropylamino, dibutylamino, dipentylamino, dihexylamino, diheptylamino, dioctylamino, dinonylamino and didecylamino; cyclohexylamino; and morpholino.

Specific examples of the organosilyl group include trimethylsilyl, triethylsilyl, tripropylsilyl, tributylsilyl, tripentylsilyl, trihexylsilyl, pentyldimethylsilyl, hexyldimethylsilyl, octyldimethylsilyl, and decyldimethylsilyl.

Specific examples of the organothio group include alkylthio groups such as methylthio, ethylthio, propylthio, butylthio, pentylthio, hexylthio, heptylthio, octylthio, nonylthio, decylthio, and laurylthio.

Specific examples of the acyl group include formyl, acetyl, propionyl, butyryl, isobutyryl, valeryl, isovaleryl, and benzoyl.

No particular limitation is imposed on the numbers of carbons in alkyl, alkoxy, thioalkyl, alkylamino, organosiloxy, organosilyl and like groups. In general, however, their carbon numbers can be from 1 to 20, with 1 to 8 being preferred.

Preferred substituents can be fluorine atoms, and sulfonic acid, substituted or unsubstituted organoxy, alkyl and organosilyl groups.

A conjugate chain formed of conjugate units bonded together may contain a cyclic moiety.

The molecular weight of the charge-transporting monomer is from 200 to 1,000.

The number average molecular weight of the charge-transporting polymer is from 5,000 to 500,000. A number average molecular weight greater than 500,000 leads to unduly low solubility to the solvent, so that most likely, the charge-transporting polymer may not be suited for use.

The number average molecular weight of the charge-transporting oligomer is generally 200 or higher, preferably 400 or higher as its lower limit for the inhibition of the evaporation of the material and for the development of charge-transporting ability, and is generally 5,000 or lower, preferably 2,000 or lower as its upper limit for the improvement of solubility. More preferably, the charge-transporting oligomer can be a charge-transporting oligomer having no molecular weight distribution. Its molecular weight is generally 200 or higher, preferably 400 or higher as a lower limit from the standpoints of the inhibition of evaporation of the material and the development of charge-transporting property and is generally 5,000 or lower, preferably 2,000 as an upper limit from the standpoint of an improvement in solubility.

It is to be noted that each number average molecular weight is a value as determined by gel permeation chromatography (polystyrene-converted).

As the charge-transporting substance, it is particularly preferred to use an oligoaniline derivative represented by the following formula (1) or a quinonediimine derivative as its oxidation product because the oligoaniline derivative or quinonediimine derivative shows high solubility and high charge-transporting property while being equipped with appropriate ionization potential. With respect to the oligoaniline derivative, it is more desired to conduct its reduction with hydrazine.

[Chemical Formula 6]

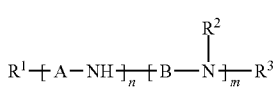
(1)

wherein $R^1$, $R^2$ and $R^3$ each independently represents a hydrogen atom, halogen atom, a hydroxyl, amino, silanol, thiol, carboxyl, sulfonic acid, phosphoric acid, phosphate ester, ester, thioester, amido, nitro, monovalent hydrocarbon, organoxy, organoamino, arganosilyl, organothio, acyl or sulfone group, and A and B each independently represents a divalent group represented by the following formula (2) or (3):

[Chemical Formula 7]

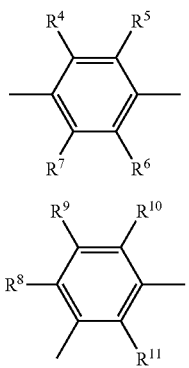
(2)
(3)

wherein $R^4$ to $R^{11}$ each independently represents a hydrogen atom, halogen atom, a hydroxyl, amino, silanol, thiol, carboxyl, sulfonic acid, phosphoric acid, phosphate ester, ester, thioester, amido, nitro, monovalent hydrocarbon, organoxy, organoamino, arganosilyl, organothio, acyl or sulfone group, and m and n are each independently an integer of at least 1 and satisfy m+n≤20.

It is to be noted that the term "quinonediimine derivative" means a compound having a partial structure represented by the following formula in its skeleton.

[Chemical Formula 8]

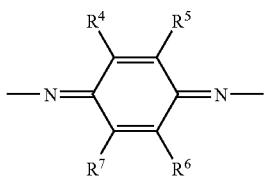

wherein $R^4$ to $R^6$ have the same meanings as defined above.

In this case, specific examples of $R^1$ to $R^{11}$ include similar substituents as those mentioned above as substituents on conjugate units, and these substituents may be substituted further by other desired substituents.

Further, the resulting charge-transporting thin film is improved in charge-transporting property if the π conjugated system in the molecule is caused to extend as much as possible. It is, therefore, especially preferred to use an oligoaniline derivative represented by the following formula (4) or a quinonediimine derivative as its oxidation product:

[Chemical Formula 9]

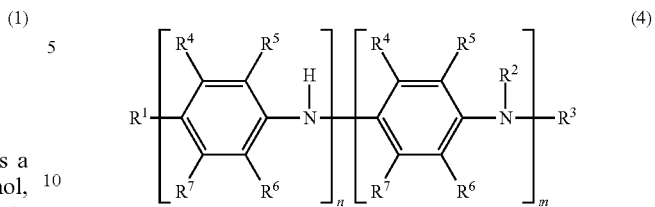
(4)

wherein $R^1$ to $R^7$, m and n have the same meanings as defined above.

In the formulas (1) and (4), m+n can preferably be 4 or greater from the standpoint of allowing to exhibit good charge-transporting property, but can preferably be 16 or smaller from the standpoint of assuring solubility to the solvent.

These charge-transporting substances can be used either singly or in combination.

Specific examples of these compounds include oligoaniline derivatives soluble in organic solvents, such as phenyltetraaniline, phenylpentaaniline, tetraaniline (aniline tetramer) and octaaniline (aniline octamer).

Although no particular limitation is imposed on the synthesis method of these charge-transporting oligomers, illustrative are the oligoaniline synthesis method [see Bulletin of Chemical Society of Japan, 67, 1749-1752 (1994) or Synthetic Metals, USA, 84, 119-120 (1997)] and the oligothiophene synthesis method [see, for example, Heterocycles, 26, 939-942 (1987) or Heterocycles, 26, 1793-1796 (1987)].

In the charge-transporting varnish according to the present invention, a charge-transporting organic material composed of the above-mentioned charge-transporting substance and a charge-accepting dopant substance can also be used in addition to the embodiment that uses the charge-transporting substance. It is to be noted that no particular limitation is imposed on the charge-transporting organic material insofar as it can be dissolved with the solvent.

As the charge-accepting dopant substance, an electron-accepting dopant substance can be used for a hole-transporting substance and a hole-accepting dopant substance can be used for an electron-transporting substance. Desirably, both of them are equipped with high charge accepting property.

As a charge-transporting oligoaniline generally shows hole-transporting property, it is preferred to use an electron-accepting dopant substance as the charge-accepting dopant substance.

Specific examples of the electron-accepting dopant include, but are not limited to, strong organic acids such as benzenesulfonic acid, tosylic acid, camphasulfonic acid, hydroxybenzenesulfonic acid, 5-sulfosalicylic acid, dodecylbenzenesulfonic acid and polystyrenic acid; and oxidizing agents such as 7,7,8,8-tetracyanoquinodimethane (TCNQ) and 2,3-dichloro-5,6-dicyano-1,4-benzoquinone (DDQ).

These electron-accepting dopant substances can be used either singly or in combination.

In the present invention, both of the charge-transporting substance and the charge-accepting dopant substance may preferably be amorphous solids. When there is a need to use a crystalline solid as at least one of these substances, however, it is preferred to use the material, which shows amorphous solid property, after forming the charge-transporting varnish into a film.

Especially when at least one of the charge-transporting substance and the charge-accepting dopant substance is a crystalline solid, this at least one substance may preferably be a substance having random molecular interaction. When a low molecular compound is used as the charge-accepting dopant, the low molecular compound may preferably be, for example, a compound which contains three or more kinds of different polar functional groups in the same molecule.

No particular limitation is imposed on such a compound, and illustrative are Tiron, dihydrobenzenesulfonic acid, and sulfonic acid derivatives represented by the formula (5), with the sulfonic acid derivatives represented by the formula (5) being particularly preferred. Specific examples of these sulfonic acid derivatives include sulfosalicylic acid derivatives, for example, 5-sulfosalicylic acid and the like.

[Chemical Formula 10]

(5)

wherein D represents a benzene, naphthalene, anthracene or phenanthrene ring or a heterocycle, and $R^{12}$ and $R^{13}$ each independently represents a carboxyl or hydroxyl group.

In addition, sulfonic acid derivatives represented by the formula (6) can also be used suitably.

[Chemical Formula 11]

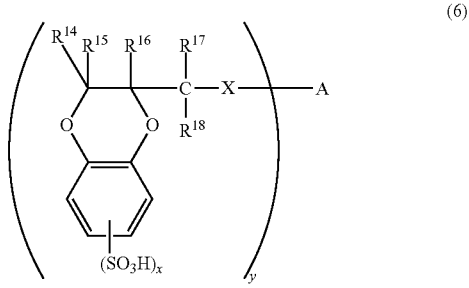

(6)

wherein $R^{14}$ to $R^{18}$ each independently represents a hydrogen atom, halogen atom, a substituted or unsubstituted, monovalent hydroxyl group, X represents a single bond, O, S or NH, A represents a hydrogen or halogen atom, O, S, S(O) group, $S(O_2)$ group, N with one or more substituted or unsubstituted groups bonded thereon, Si, P, P(O) group, or a mono- or higher valent, substituted or unsubstituted hydrocarbon group, y is an integer equal to a valence number of A and satisfies 1≤y, and x represents a number of sulfonic acid group(s) bonded on a benzene ring moiety in a 1,4-benzodioxane skeleton and satisfies 1≤x≤4.

To 1 part by weight of the charge-transporting substance, 0.01 part, preferably 0.2 part by weight of the charge-accepting dopant substance can be added generally, as a lower limit. No particular limitation is, however, imposed on its upper limit insofar as the charge-transporting substance and the charge-accepting dopant substance are completely dissolved in the solvent. Nonetheless, to 1 part by weight of the charge-transporting substance, 10 parts by weight of the charge-accepting dopant substance can be added preferably, as an upper limit.

The term "good solvent" as used herein means an organic solvent capable of dissolving the ground substance well (high-solvency solvent). Specific examples include, but are not limited to, N,N-dimethylformamide (153° C.), N,N dimethylacetamide (165° C.), N-methylpyrrolidone (202° C.), 1,3-dimethyl-2-imidazolidinone (225° C.), dimethylsulfoxide (189° C.), and N-cyclohexyl-2-pyrrolidinone (284° C.). Among these good solvents, N,N-dimethylacetamide (165° C.) and 1,3 dimethyl-2-imidazolidinone (225° C.) are preferred, with 1,3-dimethyl-2-imidazolidinone (225° C.) being more preferred. It is to be noted that the parenthesized values indicate boiling points under 760 mmHg and boiling points will hereinafter be indicated likewise.

No particular limitation is imposed on the content percentage of the good solvent based on the whole solvent used in the varnish. In general, however, its content percentage can range from 1 to 90% by weight. It is preferred to dissolve the ground substance with the good solvent.

The term "poor solvent" as used herein means an organic solvent, which adjusts the surface tension, polarity, boiling point, viscosity and the like to improve the wetting properties to a substrate such that upon baking, the resulting film can be imparted with levelness. Further, the addition of the poor solvent also has another object, that is, to prepare the varnish into a form suited for a wet process such as spin coating process, inkjet process, printing process or spray process.

Specific examples of the poor solvent will be described below, although the poor solvent shall not be limited to them.

Illustrative aromatic hydrocarbons include benzene (80° C.), toluene (111° C.), ethylbenzene (136° C.), p-xylene (138° C.), o-xylene (138° C.), and styrene (145° C.).

Illustrative ketones include acetone (56° C.), methyl ethyl ketone (80° C.), methyl isopropyl ketone (94° C.), diethyl ketone (102° C.), methyl isobutyl ketone (117° C.), methyl n-butyl ketone (127° C.), cyclohexanone (155° C.), and ethyl n-amyl ketone (167° C.).

Illustrative esters include ethyl acetate (77° C.), isopropyl acetate ketone (85° C.), n-propyl acetate (101° C.), isobutyl acetate (116° C.), n-butyl acetate (125° C.), n-amyl acetate (142° C.), methyl caproate (151° C.), 2-methylpentyl acetate (162° C.), and n-butyl lactate (186° C.).

Illustrative glycol esters and glycol ethers include ethylene glycol dimethyl ether (85° C.), propylene glycol monomethyl ether (119° C.), ethylene glycol monomethyl ether (124° C.), propylene glycol monoethyl ether (132° C.), ethylene glycol monoethyl ether (136° C.), ethylene glycol monoisopropyl ether (144° C.), ethylene glycol methyl ether acetate (145° C.), propylene glycol monomethyl ether acetate (146° C.), ethylene glycol ethyl ether acetate (156° C.), diethylene glycol dimethyl ether (162° C.), propylene glycol monobutyl ether (170° C.), ethylene glycol monobutyl ether (171° C.), diethylene glycol diethyl ether (188° C.), dipropylene glycol monomethyl ether (189° C.), diethylene glycol monomethyl ether (194° C.), dipropylene glycol monoethyl ether (198° C.), diethylene glycol monoethyl ether (202° C.), triethylene glycol dimethyl ether (216° C.), diethylene glycol monoethyl ether acetate (217° C.), and diethylene glycol (244° C.).

Illustrative alcohols include methanol (65° C.), ethanol (78° C.), isopropanol (82° C.), tert-butanol (83° C.), allyl alcohol (97° C.), n-propanol (97° C.), 2-methyl-2-butanol (102° C.), isobutanol (108° C.), n-butanol (117° C.), 2-methyl-1-butanol (130° C.), 1-pentanol (137° C.), 2-methyl-1-pentanol (148° C.), 2-ethylhexanol (185° C.), 1-octanol (196° C.), ethylene glycol (197° C.), hexylene glycol (198° C.), trimethylene glycol (214° C.), 1-methoxy-2-butanol (135° C.), cyclohexanol (161° C.), diacetone alcohol (166° C.), furfuryl alcohol (170° C.), tetrahydrofurfuryl alcohol (178° C.), propylene glycol (187° C.), benzyl alcohol (205° C.), and 1,3-butanediol (208° C.).

Illustrative phenols include anisole (154° C.), phenol (182° C.), and m-cresol (202° C.).

Illustrative ethers and carboxylic acids include isopropyl ether (68° C.), 1,4-dioxane (101° C.), acetic acid (117° C.), and γ-butyrolactone (204° C.).

Among these poor solvents, ketones, glycol ethers and alcohols are preferred, with glycol ethers and alcohols being more preferred.

The content percentage of the poor solvent based on the whole solvent for use in the varnish may be generally from 1 to 90% by weight, preferably from 1 to 50% by weight although no particular limitation is imposed thereon.

However, a combination of such a good solvent and poor solvent that, when the poor solvent is mixed with the good solvent, they do not become a uniform solution but turn into a separated or emulsified form is not preferred.

Examples of such a combination include combinations of N,N-dimethylacetamide as a good solvent with n-pentane, n-hexane, n-octane, cyclohexane and the like as poor solvents.

The present invention uses a good solvent and a poor solvent having a boiling point lower by at least 20° C. than the good solvent (under 760 mmHg). Suitable solvent compositions include, but are not limited to, N-methylpyrrolidone (202° C.) and ethylene glycol monobutyl ether (171° C.), N,N-dimethylformamide (153° C.) and methyl isobutyl ketone (117° C.), 1,3-dimethyl-2-imidazolidinone (225° C.) and isobutanol (108° C.), 1,3-dimethyl-2-imidazolidinone (225° C.) and cyclohexanol (161° C.), and 1,3-dimethyl-2-imidazolidinone (225° C.) and propylene glycol monoethyl ether (132° C.).

Among these solvent compositions, 1,3-dimethyl-2-imidazolidinone (225° C.) and isobutanol (108° C.), 1,3-dimethyl-2-imidazolidinone (225° C.) and cyclohexanol (161° C.), and 1,3-dimethyl-2-imidazolidinone (225° C.) and propylene glycol monoethyl ether (132° C.) are preferred, with 1,3-dimethyl-2-imidazolidinone (225° C.) and cyclohexanol (161° C.) being more preferred.

On the other hand, illustrative solvent compositions which are not preferred include N,N-dimethylacetamide (165° C.) and 2-phenoxyethanol (237° C.), and 1,3-dimethyl-2-imidazolidinone (225° C.) and diethylene glycol (244° C.). They use poor solvents having higher boiling points than the corresponding good solvents, and can hardly inhibit the occurrence of contamination particles.

By coating the varnish according to the present invention on a substrate and causing the solvent to evaporate, a coating can be formed. Illustrative coating processes include, but are not specifically limited to, dipping process, spin coating process, transfer printing process, brush coating process, spray process, and inkjet process. Each of these coating processes can form uniform films.

Although no particular limitation is imposed on the evaporation method of the solvent, a thin film can be obtained with a uniform film surface by conducting evaporation in an appropriate atmosphere, specifically in air, an inert gas such as nitrogen, or vacuum while using a hot plate, proximity hot plate, oven or the like.

No particular limitation is imposed on the baking temperature insofar as the solvent can evaporate, but a range of from 40 to 250° C. is preferred. To provide the resulting thin film with high levelness and high uniformity or to allow a reaction to proceed on a substrate, the temperature may be altered in two or more stages upon forming the film.

To permit a semi-quantitative assessment on a large-area substrate, contamination particles in the thin film are quantitated by using "Surfscan™ 6220", a surface particle inspection system manufactured by KLA-Tencor Corporation. By this measurement, the thin film can be observed for levelness and uniformity and also for the occurrence of contamination particles. The use of the charge-transporting varnish according to the present invention makes it possible to obtain a thin film excellent in levelness and uniformity and significantly inhibited in the occurrence of contamination particles. Suited from the standpoint of the occurrence of contamination particles is a thin film prepared especially from a charge-transporting varnish having a solid content of 1.0% and having a number of defects not greater than 100 when measured at a film thickness of 30 nm by "Surfscan™ 6220", a surface particle inspection system manufactured by KLA-Tencor Corporation, under such conditions as permitting detection of contamination particles of down to 0.5 µm at a capture rate of 80%. The use of the charge-transporting varnish according to the present invention makes it possible to readily obtain thin films while meeting the above-described defect number. Even with a varnish having a solid content of 3.0% that is a solid concentration more prone to have contamination particles occurred, thin films having defect numbers not greater than 100 under the above-described measurement conditions (film thickness: 30 nm) were obtained in some instances. The formation of thin films is conducted in a class 100 cleanroom, while the measurement of contamination particles is performed in a class 1 cleanroom.

It is to be noted that, when a laser beam irradiated onto a wafer is reflected by a defect (contamination particle or irregularity) on the wafer, the resulting light is different in angle and intensity from one reflected by a defect-free wafer. It is the basic principle of a surface particle inspection system to observe by a detector this light having different angle and intensity. The detection of this reflected light is fundamentally a matter of probability, and the term "capture rate of 80%" means that at least 80% of defects on a wafer can be observed (in other words, the "capture rate of 80% means" that the remaining 20% may not be captured).

As a method for the fabrication of an OLED device by the use of the charge-transporting varnish (charge-transporting thin film) according to the present invention and materials useful in the method, the following method and materials can be mentioned although the present invention is not limited to them.

Electrode substrates to be used are subjected beforehand to cleaning with a liquid such as a detergent, an alcohol or pure water. For anode substrates, it is preferred to conduct surface treatment such as ozone treatment or oxygen-plasma treatment shortly before use. When the anode material contains an organic material as its principal component, however, such surface treatment may be skipped.

When the hole-transporting vanish is used for OLED devices, thin films can be formed by a method to be described hereinafter.

Specifically, the hole-transporting varnish is coated by the above-described coating process on each anode substrate to form a hole-transporting thin film on the anode. The anode substrate with the hole-transporting thin film formed thereon is introduced into a vacuum evaporation system, and a hole transport layer, light-emitting layer, electron transport layer, electron injection layer and cathode metal are successively deposited to fabricate an OLED device. A carrier block layer may be arranged between desired ones of the layers to control the light-emitting region.

As an anode material, a transparent electrode led by indium-tin oxide (ITO) or indium-zinc oxide (IZO) can be mentioned, with one subjected to leveling treatment being preferred. A polythiophene derivative or polyaniline equipped with high charge-transporting property can be also used.

Examples of a material useful in forming the hole transport layer include triarylamines such as (triphenylamine) dimer derivatives (TPD), (α-naphthyldiphenylamine)dimer (α-NPD) and [(triphenylamine)dimer]spirodimer (Spiro-TAD); starburst amines such as 4,4',4"-tris[3-methylphenyl-(phenyl)amino]triphenylamine (m-MTDATA) and 4,4',4"-tris[1-naphthyl(phenyl)amino]triphenylamine (1-TNATA); and oligothiophenes such as 5,5"-bis-{4-[bis(4-methylphenyl)amino]phenyl}-2,2':5',2"-terthiophene (BMA-3T).

Examples of a material useful in forming the light-emitting layer include tris(8-quinolinolato)aluminum(III) ($Alq_3$), bis (8-quinolinolato)zinc(II) ($Znq_2$), bis(2-methyl-8-quinolinolato)(p-phenylphenolato)aluminum(III) (BAlq) and 4,4'-bis (2,2-diphenylvinyl)biphenyl (DPVBi). It is to be noted that the light-emitting may be formed by coevaporating the above-mentioned material for forming the hole transport layer or the below-described material for forming the electron transport layer and a light-emitting dopant. In this case, as the light-emitting dopant, quinacridone, rubrene, coumarin 540, 4-(dicyanomethylene)-2-methyl-6-(p-dimethylaminostyryl)-4H-pyran (DCM), tris(2-phenylpyridine)iridium (III) ($Ir(ppy)_3$) or (1,10-phenanthroline)-tris(4,4,4-trifluoro-1-(2-thienyl)-butane-1,3-dionato)europium (III) ($Eu(TTA)_3phen$) can be mentioned.

Examples of a material useful in forming the electron transport layer include $Alq_3$, BAlq, DPVBi, (2-(4-biphenyl)-5-(4-t-butylphenyl)-1,3,4-oxadiazole) (PBD), triazole derivative (TAZ), bathocuproine (BCP), and silole derivatives.

Examples of a material useful in forming the electron injection layer include lithium oxide ($Li_2O$), magnesium oxide (MgO), alumina ($Al_2O_3$), lithium fluoride (LiF), magnesium fluoride ($MgF_2$), strontium fluoride ($SrF_2$), Liq, Li(acac), lithium acetate, and lithium benzoate.

Examples of a cathode material include aluminum, magnesium-silver alloy, aluminum-lithium alloy, lithium, sodium, potassium, and cesium.

Examples of a material useful in forming the carrier block layer include PBD, TAZ, and BCP.

When the electron-transporting varnish is used for OLED devices, thin films can be formed by a method to be described hereinafter.

Specifically, the electron-transporting varnish is coated by the above-described coating process on each cathode substrate to form an electron-transporting thin film on the cathode substrate. The cathode substrate with the electron-transporting thin film formed thereon is introduced into a vacuum evaporation system. After forming an electron transport layer, light-emitting layer, hole transport layer and hole injection layer with similar materials as described above, an anode material is formed into a film by a process such as sputtering to fabricate an OLED device.

As a method for the fabrication of PLED devices by making use of the charge-transporting varnish according to the present invention, the following method can be mentioned although the fabrication method is not limited to the same.

By forming a light-emitting, charge-transporting high molecular layer instead of the vacuum deposition of the hole transport layer, light-emitting layer, electron transport layer and electron injection layer as conducted in the fabrication of the OLED device, a PLED device can be fabricated with a charge-transporting thin film formed from the charge-transporting varnish according to the present invention.

Specifically, by a similar method as in the fabrication of the OLED device, a hole-transporting thin film is formed on an anode substrate, a light-emitting, charge-transporting high molecular layer is formed over the hole-transporting thin film, and a cathode electrode is then deposited to fabricate a PLED device.

As an alternative, by a similar method as in the fabrication of the OLED device, an electron-transporting thin film is formed on a cathode substrate, a light-emitting, charge-transporting high molecular layer is formed over the electron-transporting thin film, and a cathode electrode is then formed by a method such as sputtering, evaporation or spin coating to fabricate a PLED device.

As cathode and anode materials to be used, materials similar to those exemplified with respect to the OLED device can be used. Cleaning treatment and surface treatment can also be carried out similarly to the treatment method described in connection with the OLED device.

As a method for the formation of the light-emitting, charge-transporting high molecular layer, a method can be mentioned. According to this method, a solvent is added to and dissolved or dispersed in a light-emitting, charge-transporting high molecular material or a material obtained by adding a light-emitting dopant to the light-emitting, charge-transporting high molecular material, the resulting solution or dispersion is coated on an electrode substrate with a hole injection layer formed beforehand thereon, and the solvent is then caused to evaporate to form a film.

Examples of the light-emitting, charge-transporting high molecular material include polyfluorene derivatives such as poly(9,9-dialkylfluorenes)(PDAF), polyphenylene-vinylene derivatives such as poly(2-methoxy-5-(2'-ethylhexoxy)-1,4-phenylenevinylene) (MEH-PPV), polythiophene derivatives such as poly(3-alkylthiophenes) (PAT), and polyvinylcarbazole (PVCz).

As the solvent, toluene, xylene, chloroform or the like can be mentioned. Examples of the dissolution or uniform dispersion method include stirring, heated stirring, and ultrasonic dispersion.

Examples of a coating process include, but are not particularly limited to, dipping process, spin coating process, transfer printing process, roll coating process, inkjet process, spray process, and brush coating process. It is desired to perform the coating under an inert gas such as nitrogen or argon.

As an evaporation method of the solvent, a method of heating by an oven or hot plate under an inert gas or in a vacuum can be mentioned, for example.

EXAMPLES

The present invention will hereinafter be described more specifically based on Examples and Comparative Examples, although the present invention shall not be limited to the following Examples.

Example 1

Phenyltetraaniline (hereinafter abbreviated as "PTA") represented by the formula (7) was synthesized from p-hydroxy-diphenylamine and p-phenylenediamine in accordance with Bulletin of Chemical Society of Japan, 67, 1749-1752 (1994) (yield: 85%).

[Chemical Formula 12]

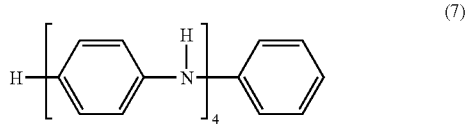

The resultant PTA (0.0500 g, 0.1130 mmol) and 5-sulfosalicylic acid (5-SSA) represented by the formula (8) (product of Wako Pure Chemical Industries, Ltd.; 0.0986 g, 0.4520 mmol)) were completely dissolved in 1,3-dimethyl-2-imidazolidinone (DMI, 5.8846 g) under a nitrogen atmosphere.

[Chemical Formula 13]

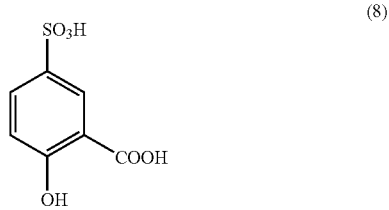 [SMILES: O=C(O)c1cc(S(=O)(=O)O)ccc1O]

To the thus-obtained solution, cyclohexanol (c-HexOH, 8.8268 g) was added, followed by stirring to prepare a charge-transporting varnish (solid content: 1.0%).

FIG. 1 illustrates the results of an inspection and measurement of surface contamination particles on a charge-transporting thin film obtained by forming a varnish of Example 1 into a film on a silicon wafer and baking the same.

Comparative Example 1

In a similar manner as in Example 1, PTA (0.0500 g, 0.1130 mmol) and 5-SSA (0.0986 g, 0.4520 mmol) were completely dissolved in N,N-dimethylacetamide (DMAc, 5.8846 g) under a nitrogen atmosphere.

Figure 2:
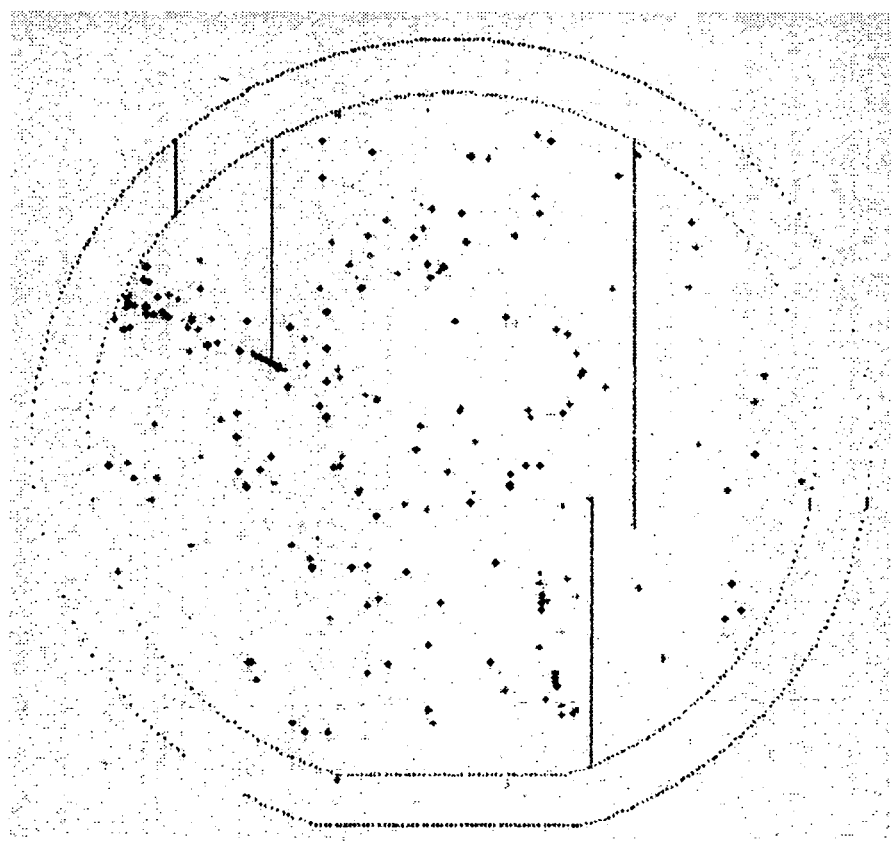
FIG. 2 is a diagram illustrating the results of an inspection and measurement of surface contamination particles on a charge-transporting thin film obtained by applying a varnish of Comparative Example 1 on a silicon wafer and baking the same.

To the thus-obtained solution, c-HexOH (8.8268 g) was added, followed by stirring to prepare a charge-transporting varnish (solid content: 1.0%). FIG. 2 illustrates the results of an inspection and measurement of surface contamination particles on a charge-transporting thin film obtained by forming a varnish of Comparative Example 1 into a film on a silicon wafer and baking the same.

Comparative Example 2

In a similar manner as in Example 1, PTA (0.0500 g, 0.1130 mmol) and 5-SSA (0.0986 g, 0.4520 mmol) were completely dissolved in DMAc (5.8846 g) under a nitrogen atmosphere.

Figure 3:
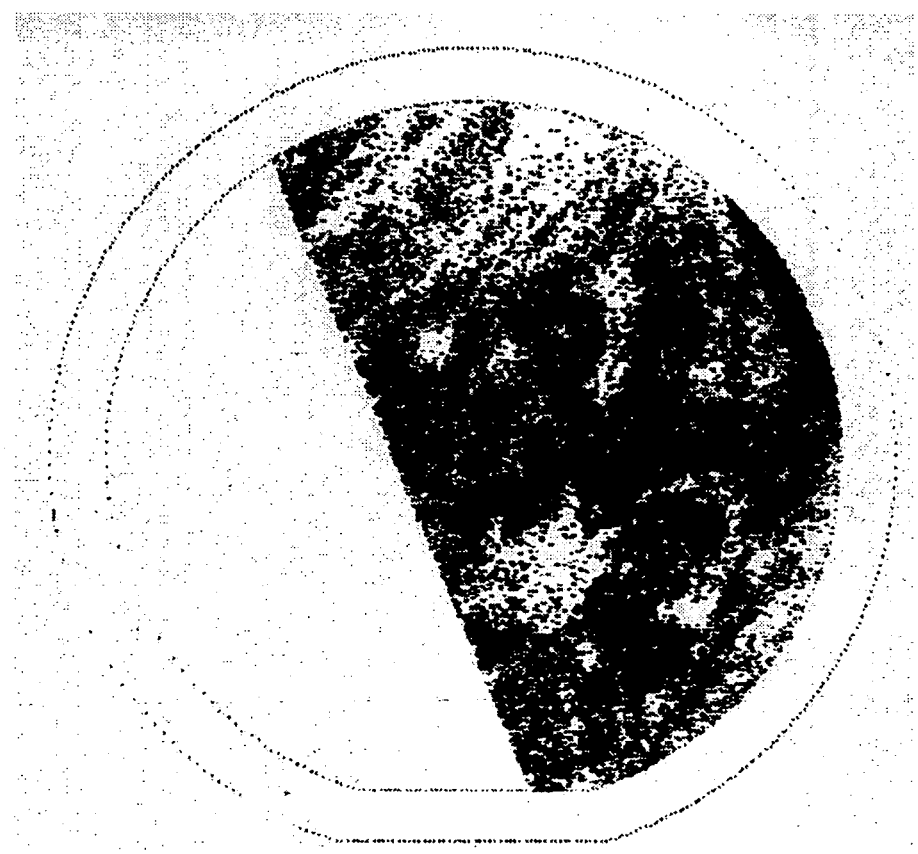
FIG. 3 is a diagram illustrating the results of an inspection and measurement of surface contamination particles on a charge-transporting thin film obtained by applying a varnish of Comparative Example 2 on a silicon wafer and baking the same.

To the thus-obtained solution, 2-phenoxyethanol (2-PhEt, 8.8268 g) was added, followed by stirring to prepare a charge-transporting varnish (solid content: 1.0%). FIG. 3 illustrates the results of an inspection and measurement of surface contamination particles on a charge-transporting thin film obtained by forming a varnish of Comparative Example 2 into a film on a silicon wafer and baking the same.

Comparative Example 3

In a similar manner as in Example 1, PTA (0.0500 g, 0.1130 mmol) and 5-SSA (0.0986 g, 0.4520 mmol) were completely dissolved in DMI (5.8846 g) under a nitrogen atmosphere.

Figure 4:
FIG. 4 is a diagram illustrating the results of an inspection and measurement of surface contamination particles on a charge-transporting thin film obtained by applying a varnish of Comparative Example 3 on a silicon wafer and baking the same.

To the thus-obtained solution, diethylene glycol (DEG, 8.8268 g) was added, followed by stirring to prepare a charge-transporting varnish (solid content: 1.0%). FIG. 4 illustrates the results of an inspection and measurement of surface contamination particles on a charge-transporting thin film obtained by forming a varnish of Comparative Example 3 into a film on a silicon wafer and baking the same.

Example 2

In a similar manner as in Example 1, PTA (0.1000 g, 0.2260 mmol) and 5-SSA (0.1972 g, 0.9040 mmol) were completely dissolved in DMI (4.1775 g) under a nitrogen atmosphere.

To the thus-obtained solution, c-HexOH (6.2662 g) was added, followed by stirring to prepare a charge-transporting varnish (solid content: 3.0%).

Example 3

In a similar manner as in Example 1, PTA (0.1000 g, 0.2260 mmol) and 5-SSA (0.1972 g, 0.9040 mmol) were completely dissolved in N-methylpyrrolidone (4.1775 g) under a nitrogen atmosphere.

To the thus-obtained solution, c-HexOH (6.2662 g) was added, followed by stirring to prepare a charge-transporting varnish (solid content: 3.0%).

Comparative Example 4

In a similar manner as in Example 1, PTA (0.1000 g, 0.2260 mmol) and 5-SSA (0.1972 g, 0.9040 mmol) were completely dissolved in DMAc (4.1775 g) under a nitrogen atmosphere.

To the thus-obtained solution, c-HexOH (6.2662 g) was added, followed by stirring to prepare a charge-transporting varnish (solid content: 3.0%).

Example 4

In a similar manner as in Example 1, PTA (0.0500 g, 0.1130 mmol) and 5-SSA (0.0986 g, 0.4520 mmol) were completely dissolved in DMAc (5.8846 g) under a nitrogen atmosphere.

To the thus-obtained solution, propylene glycol monoethyl ether (PGME, 8.8268 g) was added, followed by stirring to prepare a charge-transporting varnish (solid content: 1.0%).

Example 5

In a similar manner as in Example 1, PTA (0.0500 g, 0.1130 mmol) and 5-SSA (0.0986 g, 0.4520 mmol) were completely dissolved in DMI (5.8846 g) under a nitrogen atmosphere.

To the thus-obtained solution, propylene glycol monoethyl ether (PGME, 8.8268 g) was added, followed by stirring to prepare a charge-transporting varnish (solid content: 1.0%).

Example 6

In a similar manner as in Example 1, PTA (0.0500 g, 0.1130 mmol) and 5-SSA (0.0986 g, 0.4520 mmol) were completely dissolved in DMI (1.4711 g) under a nitrogen atmosphere.

To the thus-obtained solution, c-HexOH (13.2403 g) was added, followed by stirring to prepare a charge-transporting varnish (solid content: 1.0%).

Example 7

In a similar manner as in Example 1, PTA (0.0500 g, 0.1130 mmol) and 5-SSA (0.0986 g, 0.4520 mmol) were completely dissolved in DMI (10.2980 g) under a nitrogen atmosphere.

To the thus-obtained solution, c-HexOH (4.4134 g) was added, followed by stirring to prepare a charge-transporting varnish (solid content: 1.0%).

Example 8

In a similar manner as in Example 1, PTA (0.0500 g, 0.1130 mmol) and 5-SSA (0.0986 g, 0.4520 mmol) were completely dissolved in DMI (4.4134 g) under a nitrogen atmosphere.
To the thus-obtained solution, c-HexOH (10.2980 g) was added, followed by stirring to prepare a charge-transporting varnish (solid content: 1.0%).

Comparative Example 5

In a similar manner as in Example 1, PTA (0.0500 g, 0.1130 mmol) and 5-SSA (0.0986 g, 0.4520 mmol) were completely dissolved in DMAc (5.8846 g) under a nitrogen atmosphere.
To the thus-obtained solution, cyclohexanone (CHN, 8.8268 g) was added, followed by stirring to prepare a charge-transporting varnish (solid content: 1.0%).

Comparative Example 6

In a similar manner as in Example 1, PTA (0.0500 g, 0.1130 mmol) and 5-SSA (0.0986 g, 0.4520 mmol) were completely dissolved in DMAc (5.8846 g) under a nitrogen atmosphere.
To the thus-obtained solution, ethylene glycol monopropyl ether (EGMPE, 8.8268 g) was added, followed by stirring to prepare a charge-transporting varnish (solid content: 1.0%).

Comparative Example 7

In a similar manner as in Example 1, PTA (0.0500 g, 0.1130 mmol) and 5-SSA (0.0986 g, 0.4520 mmol) were completely dissolved in DMAc (5.8846 g) under a nitrogen atmosphere.
To the thus-obtained solution, 2-methyl-1-pentanol (2Me1PeOH, 8.8268 g) was added, followed by stirring to prepare a charge-transporting varnish (solid content: 1.0%).

Example 10

In a similar manner as in Example 1, PTA (0.0500 g, 0.1130 mmol) and 5-SSA (0.0986 g, 0.4520 mmol) were completely dissolved in DMAc (5.8846 g) under a nitrogen atmosphere.
To the thus-obtained solution, ethylene glycol methyl ether acetate (EGMEA, 8.8268 g) was added, followed by stirring to prepare a charge-transporting varnish (solid content: 1.0%).

Example 11

In a similar manner as in Example 1, PTA (0.0500 g, 0.1130 mmol) and 5-SSA (0.0986 g, 0.4520 mmol) were completely dissolved in DMAc (5.8846 g) under a nitrogen atmosphere.
To the thus-obtained solution, n-amyl acetate (MPeEst, 8.8268 g) was added, followed by stirring to prepare a charge-transporting varnish (solid content: 1.0%).

Example 12

In a similar manner as in Example 1, PTA (0.0500 g, 0.1130 mmol) and 5-SSA (0.0986 g, 0.4520 mmol) were completely dissolved in DMAc (5.8846 g) under a nitrogen atmosphere.
To the thus-obtained solution, 1-pentanol (1PeOH, 8.8268 g) was added, followed by stirring to prepare a charge-transporting varnish (solid content: 1.0%).

Comparative Example 8

In a similar manner as in Example 1, PTA (0.0500 g, 0.1130 mmol) and 5-SSA (0.0986 g, 0.4520 mmol) were completely dissolved in 1,3-dimethyl-2-imidazolidinone (DMI, 14.7114 g) under a nitrogen atmosphere to prepare a charge-transporting varnish (solid content: 1.0%).

Comparative Example 9

In a similar manner as in Example 1, PTA (0.0500 g, 0.1130 mmol) and 5-SSA (0.0986 g, 0.4520 mmol) were completely dissolved in N-methylpyrrolidone (NMP, 14.7114 g) under a nitrogen atmosphere to prepare a charge-transporting varnish (solid content: 1.0%).

Comparative Example 10

In a similar manner as in Example 1, PTA (0.0500 g, 0.1130 mmol) and 5-SSA (0.0986 g, 0.4520 mmol) were completely dissolved in N,N-dimethylacetamide (DMAc, 14.7114 g) under a nitrogen atmosphere to prepare a charge-transporting varnish (solid content: 1.0%).

Comparative Example 11

In a similar manner as in Example 1, cyclohexanol (c-HexOH, 14.7114 g) was added to PTA (0.0500 g, 0.1130 mmol) and 5-SSA (0.0986 g, 0.4520 mmol) under a nitrogen atmosphere. PTA did not dissolve at all in c-HexOH, and a charge-transporting varnish with the solid dispersed therein was prepared (calculated solid content: 1.0%).

Comparative Example 12

In a similar manner as in Example 1, methanol (MeOH, 14.7114 g) was added to PTA (0.0500 g, 0.1130 mmol) and 5-SSA (0.0986 g, 0.4520 mmol) under a nitrogen atmosphere. PTA did not dissolve at all in MeOH, and a charge-transporting varnish with the solid dispersed therein was prepared (calculated solid content: 1.0%).

Comparative Example 13

In a similar manner as in Example 1, glycerin (Gly, 14.7114 g) was added to PTA (0.0500 g, 0.1130 mmol) and 5-SSA (0.0986 g, 0.4520 mmol) under a nitrogen atmosphere. PTA did not dissolve at all in Gly, and a charge-transporting varnish with the solid dispersed therein was prepared (calculated solid content: 1.0%).

Comparative Example 14

In a similar manner as in Example 1, methanol (MeOH, 10.2980 g) and cyclohexanol (c-HexOH, 4.4134 g) (MeOH:c-HexOH=7:3) were added to PTA (0.0500 g, 0.1130 mmol) and 5-SSA (0.0986 g, 0.4520 mmol) under a nitrogen atmosphere. PTA did not dissolve at all in the 7:3 mixed solvent of MeOH and c-HexOH, and a charge-transporting varnish with the solid dispersed therein was prepared (calculated solid content: 1.0%).

Comparative Example 15

In a similar manner as in Example 1, methanol (MeOH, 10.2980 g) and glycerin (Gly, 4.4134 g) (MeOH:Gly=7:3) were added to PTA (0.0500 g, 0.1130 mmol) and 5-SSA (0.0986 g, 0.4520 mmol) under a nitrogen atmosphere. PTA did not dissolve at all in the 7:3 mixed solvent of MeOH and Gly, and a charge-transporting varnish with the solid dispersed therein was prepared (calculated solid content: 1.0%).

Each varnish was coated by spin coating process on a silicon wafer which had been subjected to cleaning with ozone for 40 minutes, and baking was conducted in air at 200° C. for 60 minutes to form a charge-transporting thin film as a 30 nm thin film. The silicon wafer was exposed in a class 100 cleanroom, and its baking was also conducted in the cleanroom to the last. Employed as the silicon wafer was a standardized product of 6 inch diameter, N type, 5 to 7 Ωcm resistivity, (100) orientation and 625±25 nm thickness.

The film thickness was measured by using "DEKTAK3ST", a surface profiler manufactured by Japan Vacuum Technology Co., Ltd., and Ip was measured by using "AC-2", a photoelectron spectrometer manufactured by Riken Keiki Co., Ltd. The quantitation of contamination particles was conducted by using "Surfscan™ 6220", a surface particle inspection system manufactured by KLA-Tencor Corporation.

Each surface particle inspection was performed in a class 1 cleanroom. The surface particle inspection system was set under the conditions that contamination particles down to 0.5 μm were detected at a capture rate of 80% and their sizes were measured and counted. For a laser beam, am argon ion laser was used. The laser beam was focused on a circle of 90 μm in diameter, and a direct pass was high-speed scanned at normal incidence to the substrate surface (it is to be noted that no other scanning method can be adopted in "Surfscan™ 6220", the surface particle inspection system manufactured by KLA-Tencor Corporation). When a laser beam illuminates a contamination particle on a substrate, light scatters in all directions from the pint of incidence. This scattered light is collected in an optical system, and is then guided into a low-noise photomultiplier. Subsequent to multiplication, it is digitized.

The digitized contamination particles are classified into 0.5-0.6, 0.6-0.7, 0.7-0.8, 0.8-0.9, 0.9-1.0, 1.0-3.0, 3.0-5.0, and 5.0-28.0 μm, and in each defect size range, the total count can be obtained. It is to be noted that the upper limit of defect number, at which contamination particles can still be counted, was set at 30,000.

Strictly speaking, each defect number is an optically-corrected value as mentioned above. Accordingly, defects other than contamination particles, such as scratches and the like on a substrate, are also included. The surface particle inspection, therefore, paid scrupulous attention to effects of scratches and the like on the substrate to eliminate scratch-derived data.

Table 1 shows the results of the surface particle inspections and measurements in Example 1 and Comparative Examples 1-3.

Example 1 is directed to a system in which the composition of the mixed solvent consisted of a good solvent and a poor solvent having a boiling point lower by at least 20° C. than the good solvent (under 760 mmHg). The boiling point of DMI as the good solvent is 225° C., while that of c-HexOH as the poor solvent is 161° C.

Comparative Example 1, on the other hand, is directed to a system in which the composition of the mixed solvent consisted of a good solvent and a poor solvent having substantially the same boiling point as the good solvent (under 760 mmHg). The boiling point of DMAc as the good solvent is 165° C., while that of c-HexOH as the poor solvent is 161° C.

Further, Comparative Examples 2 and 3 are each directed to a system in which the composition of the mixed solvent consisted of a good solvent and a poor solvent having a higher boiling point than the good solvent (under 760 mmHg). In Comparative Example 2, the boiling point of DMAc as the good solvent is 165° C., while that of 2-PhEt as the poor solvent is 237° C. In Comparative Example 3, the boiling point of DMI as the good solvent is 225° C., while that of DEG as the poor solvent is 244° C.

In FIG. 1 and FIG. 2, defects were inhibited, and extremely good charge-transporting thin films with contamination particles contained only a little were obtained. They are examples directed to 1% solid content. As a standard, a thin film was rated as a "good thin film surface" when the number of defects was 100 or less.

From a comparison between FIG. 1 and FIG. 2, it is appreciated that contamination particles were inhibited better in FIG. 1 (Example 1). In each of FIG. 3 and FIG. 4, on the other hand, the number of defects reached a level greater than 30,000 as the upper limit. When fabricated into organic EL devices, contamination particles on such charge-transporting thin films become a cause of electrical short circuiting, and hence, serve as a factor that induces reductions in yield and fabrication efficiency.

TABLE 1

|  | Good solvent | | Poor solvent | |
| --- | --- | --- | --- | --- |
|  | Name | Boiling point | Name | Boiling point |
| Example 1 | DMI | 225° C. | c-HexOH | 161° C. |
| Comparative Example 1 | DMAc | 165° C. | c-HexOH | 161° C. |
| Comparative Example 2 | DMAc | 165° C. | 2-PhEt | 237° C. |
| Comparative Example 3 | DMI | 225° C. | DEG | 244° C. |

| | Defect size distribution (μm) | | | | | | | | |
| --- | --- | --- | --- | --- | --- | --- | --- | --- | --- |
|  | 0.5-0.6 | 0.6-0.7 | 0.7-0.8 | 0.8-0.9 | 0.9-1.0 | 1.0-3.0 | 3.0-5.0 | 5.0-28.0 | Total |
| Example 1 | 8 | 7 | 6 | 2 | 2 | 18 | 8 | 8 | 59 |
| Comparative Example 1 | 21 | 10 | 8 | 6 | 2 | 50 | 22 | 104 | 223 |
| Comparative Example 2 | 1647 | 1574 | 1344 | 1245 | 1016 | 8057 | 3864 | 11253 | 30000 |
| Comparative Example 3 | 2827 | 2294 | 1922 | 1648 | 1280 | 11739 | 4194 | 4096 | 30000 |

Table 2 shows the results of surface particle inspections and measurements in Examples 2 and 3 and Comparative Example 4. They are examples directed to 3% solid content, and the experiments were conducted under conditions more prone to have contamination particles occurred. As a standard, a thin film was rated as a "good thin film surface" when the number of defects was 300 or less.

Examples 2 and 3 and Comparative Example 4 are directed to varnishes prepared by making changes only in the boiling point of the good solvent. DMI the boiling point of which is 225° C. was selected as a good solvent in Example 2, NMP the boiling point of which is 202° C. was selected as a good solvent in Example 3, and DMAc the boiling point of which is 165° C. was selected as a good solvent in Comparative Example 4. As a poor solvent in each mixed solvent, c-HexOH the boiling point of which is 161° C. was selected and was unchanged.

As shown in Table 2, it is appreciated that a solvent composition, in which the boiling point of a good solvent is higher and has a greater difference from that of a poor solvent, is more effective for the inhibition of defects on a substrate and provides a better thin film surface.

Such a tendency in the number of defects is considered to be attributable to the mechanism that, when a varnish on a substrate evaporates, a solvent of a lower boiling point evaporates earlier and a solvent of a higher boiling point evaporates later. In the case of such a solvent composition that an organic solvent as a poor solvent for a solute evaporates later, the solvent composition is considered to promote the precipitation and/or coagulation of the solute and hence to lead to the occurrence of contamination particles and an increase in the number of defects.

TABLE 2

|  | Good solvent | | Poor solvent | |
| --- | --- | --- | --- | --- |
|  | Name | Boiling point | Name | Boiling point |
| Example 2 | DMI | 225° C. | c-HexOH | 161° C. |
| Example 3 | NMP | 202° C. | c-HexOH | 161° C. |
| Comparative Example 4 | DMAc | 165° C. | c-HexOH | 161° C. |

| | Defect size distribution (μm) | | | | | | | | |
| --- | --- | --- | --- | --- | --- | --- | --- | --- | --- |
|  | 0.5-0.6 | 0.6-0.7 | 0.7-0.8 | 0.8-0.9 | 0.9-1.0 | 1.0-3.0 | 3.0-5.0 | 5.0-28.0 | Total |
| Example 2 | 9 | 5 | 7 | 4 | 0 | 23 | 7 | 19 | 74 |
| Example 3 | 45 | 25 | 25 | 12 | 14 | 81 | 16 | 41 | 259 |
| Comparative Example 4 | 32 | 22 | 16 | 16 | 22 | 154 | 63 | 185 | 510 |

Table 3 shows the results of surface particle inspections and measurements in Examples 1, 4 and 5 and Comparative Example 1.

In these examples and comparative example, an investigation was conducted to determine whether or not good thin film surfaces would be available even from poor solvents other than the above-discussed c-HexOH.

In Examples 4 and 5, PGME the boiling point of which is 132° C. was selected as a poor solvent. As shown in Table 3, it is appreciated that a good thin film surface is available despite a change to the kind of poor solvent.

TABLE 3

|  | Good solvent | | Poor solvent | |
| --- | --- | --- | --- | --- |
|  | Name | Boiling point | Name | Boiling point |
| Example 1 | DMI | 225° C. | c-HexOH | 161° C. |
| Example 4 | DMAc | 165° C. | PGME | 132° C. |
| Example 5 | DMI | 225° C. | PGME | 132° C. |

| | Defect size distribution (μm) | | | | | | | | |
| --- | --- | --- | --- | --- | --- | --- | --- | --- | --- |
|  | 0.5-0.6 | 0.6-0.7 | 0.7-0.8 | 0.8-0.9 | 0.9-1.0 | 1.0-3.0 | 3.0-5.0 | 5.0-28.0 | Total |
| Example 1 | 8 | 7 | 6 | 2 | 2 | 18 | 8 | 8 | 59 |
| Example 4 | 10 | 7 | 6 | 2 | 1 | 26 | 11 | 8 | 71 |
| Example 5 | 6 | 4 | 3 | 0 | 3 | 13 | 5 | 20 | 54 |

Table 4 shows the results of surface particle inspections and measurements in Examples 1, 6, 7 and 8.

It has already been demonstrated that the good thin film surface was obtained in Example 1. As the ratio of the good solvent to the poor solvent in each of the above-demonstrated solvent compositions was 4:6 (wt. %), an investigation was conducted to determine whether or not good thin film surfaces would be available even from solvent ratios other than the above solvent ratio.

Varnishes were prepared by setting the ratio of the good solvent to the poor solvent at 1:9 in Example 6, at 7:3 in Example 7, and at 3:7 in Example 8, respectively. As shown in Table 4, it is appreciated that a good thin film surface is available despite a change to the solvent-to-solvent ratio in a mixed solvent.

TABLE 4

| | Solvent composition | | Ratio (wt. %) | |
|---|---|---|---|---|
| | Good solvent | Poor solvent | DMI | c-HexOH |
| Example 1 | DMI | c-HexOH | 4 | 6 |
| Example 6 | DMI | c-HexOH | 1 | 9 |
| Example 7 | DMI | c-HexOH | 7 | 3 |
| Example 8 | DMI | c-HexOH | 3 | 7 |

| | Defect size distribution (μm) | | | | | | | | |
|---|---|---|---|---|---|---|---|---|---|
| | 0.5-0.6 | 0.6-0.7 | 0.7-0.8 | 0.8-0.9 | 0.9-1.0 | 1.0-3.0 | 3.0-5.0 | 5.0-28.0 | Total |
| Example 1 | 8 | 7 | 6 | 2 | 2 | 18 | 8 | 8 | 59 |
| Example 6 | 6 | 4 | 6 | 6 | 5 | 22 | 5 | 5 | 59 |
| Example 7 | 5 | 5 | 4 | 6 | 5 | 25 | 4 | 8 | 62 |
| Example 8 | 14 | 3 | 2 | 6 | 0 | 20 | 2 | 14 | 61 |

Table 5 shows the results of surface particle inspections and measurements in Examples 9 to 11 and Comparative Examples 5 to 7.

As a result of the inspections and measurements of surface particles, it has been indicated that in a mixed solvent of a good solvent and a poor solvent, a solvent composition in which the boiling point of the good solvent is higher than that of the poor solvent under 760 mmHg provides a good thin film surface. An investigation was, therefore, conducted to determine a threshold as to how much (X° C.) a difference ($\Delta_T$) should be in boiling point between a good solvent and a poor solvent to be actually effective for the inhibition of contamination particles.

In Examples 9 to 11, DMAc the boiling point of which is 165° C. was selected as a good solvent, and as poor solvents, EGMEA the boiling point of which is 145° C. ($\Delta_T$=20° C.), MPeEst the boiling point of which is 142° C. ($\Delta_T$=23° C.) and 1PeOH the boiling point of which is 137° C. ($\Delta_T$=28° C.) were selected, respectively, to prepare mixed solvents.

In Comparative Examples 5 to 7, DMAc the boiling point of which is 165° C. was selected as a good solvent, and as poor solvents, 2Me1PeOH the boiling point of which is 148° C. ($\Delta_T$=17° C.), CHN the boiling point of which is 155° C. ($\Delta_T$=10° C.) and EGMPE the boiling point of which is 150° C. ($\Delta_T$=15° C.) were selected, respectively, to prepare mixed solvents. Selected as the poor solvents were those capable of giving 10, 15, 17, 20, 23 and 28° C. as $\Delta_T$ when the good solvent, that is, DMAc the boiling point of which is 165° C. was unchanged. At that time, n-pentane, n-hexane, n-octane, n-nonane, cyclohexane and the like, which are not miscible with good solvents as mentioned above, were not selected.

As shown in Tale 5, thin film surfaces which had low defect numbers and contained contamination particles very little were obtained in Examples 9 to 11. In Comparative Examples 5 to 7, on the other hand, the defect number increased considerably, resulting in thin film surfaces with many contamination particles contained therein. This is presumably attributable to the excessive closeness of the boiling points of the poor solvents to that of the good solvent. When the difference ($\Delta_T$) in boiling point between a good solvent and a poor solvent s small, the good solvent and poor solvent evaporate substantially at the same time upon firing the substrate. Solute-derived contamination particles are, therefore, presumed to occur from locations where the poor solvent is localized.

Considering the results of Example 12 together, the threshold of a difference in boiling point between a good solvent and a poor solvent, said threshold being capable of inhibiting the occurrence of contamination particles, has been found to be 20° C. because contamination particles occur when the difference $\Delta_T$ in boiling point between a good solvent and a poor solvent is 17° C. but the occurrence of contamination particles can be inhibited at 20° C.

TABLE 5

| | Good solvent | | Poor solvent | | Difference in boiling point, $\Delta_T$ |
|---|---|---|---|---|---|
| | Name | Boiling point | Name | Boiling point | |
| Comparative Example 5 | DMAc | 165° C. | CHN | 155° C. | 10° C. |
| Comparative Example 6 | DMAc | 165° C. | EGMPE | 150° C. | 15° C. |

TABLE 5-continued

| | | | | | |
|---|---|---|---|---|---|
| Comparative Example 7 | DMAc | 165° C. | 2MelPeOH | 148° C. | 17° C. |
| Example 9 | DMAc | 165° C. | EGMEA | 145° C. | 20° C. |
| Example 10 | DMAc | 165° C. | MPeEst | 142° C. | 23° C. |
| Example 11 | DMAc | 165° C. | 1PeOH | 137° C. | 28° C. |
| Example 4 | DMAc | 165° C. | PGME | 132° C. | 33° C. |

| | Defect size distribution (μm) | | | | | | | |
|---|---|---|---|---|---|---|---|---|
| | 0.5-0.6 | 0.6-0.7 | 0.7-0.8 | 0.8-0.9 | 0.9-1.0 | 1.0-3.0 | 3.0-5.0 | 5.0-28.0 | Total |
| Comparative Example 5 | 534 | 402 | 278 | 159 | 111 | 380 | 60 | 50 | 1974 |
| Comparative Example 6 | 106 | 50 | 31 | 26 | 16 | 115 | 24 | 12 | 380 |
| Comparative Example 7 | 37 | 15 | 6 | 3 | 3 | 44 | 5 | 6 | 119 |
| Example 9 | 21 | 13 | 8 | 4 | 2 | 22 | 4 | 12 | 86 |
| Example 10 | 6 | 8 | 3 | 5 | 4 | 27 | 7 | 15 | 75 |
| Example 11 | 8 | 6 | 4 | 6 | 3 | 25 | 9 | 16 | 77 |
| Example 4 | 10 | 7 | 6 | 2 | 1 | 26 | 11 | 8 | 71 |

Table 6 shows the results of inspections and measurements of surface particles on surfaces of thin films obtained from the charge-transporting varnishes of Comparative Examples 8 to 10. Comparative Examples 8 to 10 are directed to examples each composed solely of a good solvent for PTA and SSA.

From the results of Table 6, it has been found that a surface of a thin film obtained from a charge-transporting varnish making use of only a good solvent carries only a relatively small number of contamination particles. Before baking or upon baking, however, the charge-transporting varnish making use of only the good solvent exhibited only low leveling effect, and macroscopic irregularities occurred without being formed into a uniform film surface. Macroscopic irregularities were such irregularities as being visually observable, and the locations of their occurrence concentrated especially at edge portions. As these macroscopic irregularities can be detected by a surface particle inspection and measurement, they were confirmed as defects as many as 200 to 300 or so in total. For obtaining a uniform and high-levelness, thin film surface without occurrence of contamination particles, it is effective to add a poor solvent equipped with a leveling function, as shown in Examples 1 and 4.

Comparative Examples 14 to 15 are directed to examples each composed of a solvent formed of two poor solvents for PTA.

From the results of Table 7, it has been confirmed that a surface of a thin film obtained from a charge-transporting varnish making use of only poor solvent(s) carries a very large number of contamination particles beyond a measurable limit.

Each varnish according to the present invention requires as a premise that its solid components is completely dissolved in its organic solvent. It has been found that a system in which one of its solid components is not dissolved leads to a thin film surface with considerably large roughness.

In addition, a number of contamination particles which were too large to detect within the defect size range of the surface particle inspection and measurement were visually observed.

In a system in which PTA and SSA (host and acceptor) are completely dissolved in an organic solvent as in Example 1, doping has been effected in a dissolved state. The system can

TABLE 6

| | Good solvent | |
|---|---|---|
| | Name | Boiling point |
| Comparative Example 8 | DMI | 225° C. |
| Comparative Example 9 | NMP | 202° C. |
| Comparative Example 10 | DMAc | 165° C. |

| | Defect size distribution (μm) | | | | | | | |
|---|---|---|---|---|---|---|---|---|
| | 0.5-0.6 | 0.6-0.7 | 0.7-0.8 | 0.8-0.9 | 0.9-1.0 | 1.0-3.0 | 3.0-5.0 | 5.0-28.0 | Total |
| Comparative Example 8 | 29 | 28 | 23 | 14 | 11 | 78 | 12 | 28 | 223 |
| Comparative Example 9 | 33 | 29 | 18 | 13 | 8 | 55 | 26 | 85 | 267 |
| Comparative Example 10 | 106 | 50 | 31 | 26 | 16 | 115 | 24 | 12 | 380 |

Table 7 shows the results of inspections and measurements of surface particles on surfaces of thin films obtained from the charge-transporting varnishes of Comparative Examples 11 to 15. Comparative Examples 11 to 13 are directed to examples each composed solely of a poor solvent for PTA.

be readily formed into a film, and a uniform charge-transporting thin film of high levelness can be obtained. In the case of a system in which SSA is dissolved but PTA is not dissolved as in Comparative Examples 11 to 13, the doping between the host and the acceptor does not proceed in a solution, resulting in deteriorated film-forming property. It is, therefore, impossible to obtain any uniform charge-transporting thin film of high levelness.

Especially when c-HexOH is selected as a solvent in a charge-transporting varnish as in Comparative Example 11, the melting point of c-HexOH is 21 to 25° C. so that at temperatures below the melting point, c-HexOH solidifies and the charge-transporting varnish becomes poor in handling ease and storage stability and is most unlikely applicable to an actual process.

In Comparative Examples 14 and 15 in each of which a mixed solvent of two poor solvents was selected as a solvent composition for an electrically-conductive varnish, it was also found that similar to Comparative Examples 11 to 13, the thin film surfaces had considerably large roughness. In addition, a number of contamination particles which were too large to detect within the defect size range of the surface particle inspection and measurement were visually observed. It has, therefore, been found that, when a mixed solvent is used, there is a need to use at least one good solvent for a solute.

TABLE 7

| | Poor solvent | |
|---|---|---|
| | Name | Boiling point |
| Comparative Example 11 | c-HexOH | 161° C. |
| Comparative Example 12 | MeOH | 65° C. |
| Comparative Example 13 | Gly | 290° C. |
| Comparative Example 14 | c-HexOH:MeOH = 3:7 | |
| Comparative Example 15 | Gly:MeOH = 3:7 | |

| | Defect size distribution (μm) | | | | | | | |
|---|---|---|---|---|---|---|---|---|
| | 0.5-0.6 | 0.6-0.7 | 0.7-0.8 | 0.8-0.9 | 0.9-1.0 | 1.0-3.0 | 3.0-5.0 | 5.0-28.0 | Total |
| Comparative Example 11 | 3406 | 2902 | 2461 | 2144 | 1635 | 11862 | 2884 | 2706 | 30000 |
| Comparative Example 12 | 2954 | 2711 | 2466 | 2182 | 1752 | 12576 | 2965 | 2394 | 30000 |
| Comparative Example 13 | 2717 | 2372 | 2033 | 1804 | 1558 | 12502 | 3730 | 3284 | 30000 |
| Comparative Example 14 | 2695 | 2312 | 2042 | 1827 | 1482 | 12282 | 3587 | 3773 | 30000 |
| Comparative Example 15 | 2801 | 2414 | 2097 | 1833 | 1520 | 12373 | 3433 | 3529 | 30000 |

Example 12

After a 30 nm hole-transporting thin film was formed with the charge-transporting varnish of Example 1 on an ITO-coated glass substrate, the substrate with the thin film formed thereon was introduced into a vacuum evaporation system to successively deposit α-NPD, Alq$_3$, LiF and Al. With their thicknesses preset at 40 nm, 60 nm, 0.5 nm and 100 nm, respectively, evaporation operations were each conducted after the pressure was reduced to 8×10$^{-4}$ Pa or lower. Upon conducting the evaporation operations, the deposition rate was at 0.3 to 0.4 nm/s for the materials other than LiF and at 0.02 to 0.04 nm/s for LiF. The series of those evaporation operations were conducted under vacuum until all the layers were deposited. After the hole-transporting thin film was formed on the ITO-coated glass substrate, the substrate with the thin film formed thereon was introduced into the vacuum evaporation system, and Al was deposited to 100 nm, a current was fed at 30 nm film thickness and 100 mA/cm$^2$, and from the resulting current-voltage characteristics, the conductivity was calculated.

Example 13

In a similar manner as in Example 12 except for the use of the charge-transporting varnish of Example 4, an OLED device was fabricated and its characteristics were assessed.

Example 14

In a similar manner as in Example 12 except for the use of the charge-transporting varnish of Example 5, an OLED device was fabricated and its characteristics were assessed.

Comparative Example 16

In a similar manner as in Example 12 except for the use of the charge-transporting varnish of Comparative Example 1, an OLED device was fabricated and its characteristics were assessed.

Comparative Example 17

In a similar manner as in Example 12 except for the use of the charge-transporting varnish of Comparative Example 2, an OLED device was fabricated and its characteristics were assessed.

Comparative Example 18

In a similar manner as in Example 12 except for the use of the charge-transporting varnish of Comparative Example 3, an OLED device was fabricated and its characteristics were assessed.

Comparative Example 19

After an ITO glass substrate was cleaned with ozone for 40 minutes, the thus-cleaned ITO glass substrate was introduced into a vacuum evaporation system, and within the vacuum evaporation system, copper phthalocyanine (CuPC) was deposited to 30 nm on the ITO glass substrate. Subsequent to the deposition, α-NPD, Alq$_3$, LiF and Al were successively deposited under the same conditions as in the method described in Example 12. Characteristics of the resulting OLED device were assessed.

Comparative Example 20

An aqueous polyethylenedioxythiophene-polystyrenesulfonic acid solution was coated on an ITO-coated glass substrate by spin coating process, followed by baking at 120° C. for 1 hour in air to obtain a 30 nm thin film. Using that thin film, an OLED device was fabricated by the method described in Example 12, and characteristics of the OLED device were assessed.

Table 8 shows the characteristics, Ip and conductivities of the OLED devices of Examples 12 to 14 and Comparative Examples 16 to 20. As the characteristics of each OLED device, its light-emission initiating voltage and its voltage, brightness and luminance efficiency at 10 mA/cm² and 50 mA/cm² as thresholds are shown.

The characteristics of the OLED devices were measured using an organic EL luminance efficiency measurement system ("EL103", manufactured by Precise Gauges Co., Ltd.).

The effect of contamination particles on a substrate, which become a cause of electrical short circuiting, pronouncedly appears in the luminance efficiency in the case of the charge-transporting thin film according to the present invention. When contamination particles occur, a concentration of charges takes place at the locations of the contamination particles to inject a current so that the luminance efficiency is reduced. In other words, it is known that a charge-transporting thin film which contains contamination particles only a little is good in luminance efficiency.

Uniform luminance was also observed on the OLED devices of Examples 13 and 14, which had thin films formed from varnishes with mixed solvents prepared by using PGME as a poor solvent.

As the characteristics of the OLED devices of Comparative Examples 19 and 20 which used CuPC, a commonly-employed hole-transporting material, and polyethylenedioxythiophene-polystyrene sulfonic acid, respectively, in dry processes, the OLED devices were lower in luminance efficiency at the thresholds of 10 mA/cm² and 50 mA/cm² than those making use of charge-transporting thin films according to the present invention.

The invention claimed is:

1. A charge-transporting varnish comprising:

a substrate comprising an oligomer having a molecular weight of from 200 to 2,000; and a solvent comprising a good solvent and a poor solvent having a boiling point lower by at least 20° C. than said good solvent under 760 mmHg, wherein said good solvent is 1,3-dimethyl-2-imidazolidinone and said poor solvent is at least one selected from the group consisting of ketones, glycol ethers and alcohols; and wherein said substrate is dissolved in said solvents, wherein said oligomer is an oligoaniline derivative represented by the following formula (4) or a quinonediimine derivative as an oxidation product of the formula (4):

TABLE 8

| | Film thickness (nm) | Ip (eV) | Conductivity at 100 mA/cm² (S/cm) | Light-emitting initiating voltage (V) | Upon 10 mA/cm² current feeding | | | Upon 50 mA/cm² current feeding | | | Observation of light-emitting surface |
|---|---|---|---|---|---|---|---|---|---|---|---|
| | | | | | Voltage (V) | Brightness (cd/m²) | Luminance efficiency | Voltage (V) | Brightness (cd/m²) | Luminance efficiency | |
| Example 12 | 30 | 5.34 | 5.13 × 10⁻⁷ | 2.75 | 8.33 | 728 | 7.26 | 10.30 | 4014 | 8.01 | Uniform luminance |
| Example 13 | 30 | 5.34 | 6.57 × 10⁻⁷ | 2.75 | 7.43 | 499 | 4.99 | 9.07 | 2936 | 5.87 | Uniform luminance |
| Example 14 | 30 | 5.33 | 6.33 × 10⁻⁷ | 2.75 | 7.93 | 559 | 5.59 | 9.92 | 3193 | 6.38 | Uniform luminance |
| Comparative Example 16 | 30 | 5.33 | 5.07 × 10⁻⁷ | 2.75 | 7.58 | 642 | 6.42 | 9.32 | 3790 | 7.55 | Uniform luminance |
| Comparative Example 17 | 30 | 5.33 | 8.59 × 10⁻⁷ | 2.75 | 7.01 | 484 | 4.84 | 8.61 | 2913 | 5.82 | Nonuniform luminance |
| Comparative Example 18 | 30 | 5.33 | 8.32 × 10⁻⁷ | 2.75 | 7.28 | 450 | 4.49 | 9.29 | 2908 | 5.83 | Nonuniform luminance |
| Comparative Example 19 | 30 | 5.30 | 1.51 × 10⁻⁷ | 3.00 | 6.59 | 193 | 1.91 | 8.65 | 2240 | 2.24 | Uniform luminace |
| Comparative Example 20 | 30 | 5.30 | 1.34 × 10⁻⁶ | 3.25 | 6.53 | 105 | 1.02 | 7.22 | 924 | 0.94 | Uniform luminace |

In the characteristics of the OLED devices, Example 12 which used a thin film reduced in defect number was improved by about 2 to 3 cd/A or so in luminance efficiency over Comparative Examples 17 and 18 which used thin films of very large defect numbers. Further, the light-emitting surface of the OLED device of Example 12 showed uniform luminance, but the light-emitting surfaces of the OLED devices of Comparative Examples 17 and 18 showed nonuniform luminance.

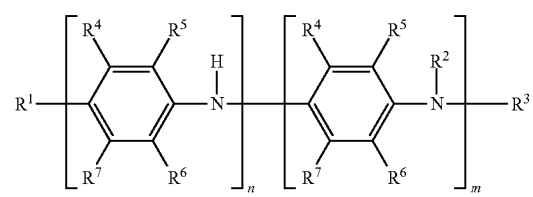

(4)

wherein R¹ to R⁷ each independently represents a hydrogen atom, halogen atom, a hydroxyl, amino, silanol, thiol, carboxyl, sulfonic acid, phosphoric acid, phosphate ester, ester, thioester, amido, nitro, monovalent hydrocarbon, organoxy, organoamino, organosilyl, organothio, acyl or sulfone group, and m and n are each independently an integer of at least 1 and satisfy m+n≤20.

2. The charge-transporting varnish according to claim 1, wherein said substrate further comprises an electron-accepting dopant substance or hole-accepting dopant substance.

3. The charge-transporting varnish according to claim 2, wherein said substrate comprises an electron-accepting dopant substance which is a sulfonic acid derivative represented by the following formula (5):

(5)

wherein D represents a benzene, naphthalene, anthracene or phenanthrene ring or a heterocycle, and R¹² and R¹³ each independently represents a carboxyl or hydroxyl group.

4. The charge-transporting varnish according to claim 2, wherein said substrate comprises an electron-accepting dopant substance which is a sulfonic acid derivative represented by the following formula (6):

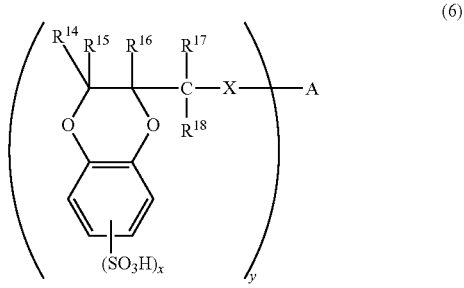

(6)

wherein R¹⁴ to R¹⁸ each independently represents a hydrogen atom, a substituted or unsubstituted, monovalent hydroxyl group, or a halogen atom, X represents a single bond, O, S or NH, A represents a hydrogen or halogen atom, O, S, S(O) group, S(O₂) group, N with one or more substituted or unsubstituted groups bonded thereon, Si, P, P(O) group, or a mono- or higher valent, substituted or unsubstituted hydrocarbon group, y is an integer equal to a valence number of A and satisfies 1≤y, and x represents a number of sulfonic acid group(s) bonded on a benzene ring moiety in a 1,4-benzodioxane skeleton and satisfies 1≤x≤4.

5. A thin film fabricated from the varnish according to claim 1.

6. A charge-transporting thin film fabricated from the charge-transporting varnish according to claim 2.

7. An organic electroluminescence device comprising the charge-transporting thin film according to claim 6.

8. The organic electroluminescence device according to claim 7, wherein said charge-transporting thin film is a hole injection layer or hole transport layer.

9. A method for the fabrication of a thin film, comprising coating the varnish according to claim 1 on a substrate.

10. A method for the fabrication of a charge-transporting thin film, comprising coating the charge-transporting varnish according to claim 2 on a substrate.

11. The charge-transporting varnish according to claim 1, wherein said poor solvent is selected from the group consisting of isobutanol and propylene glycol monoethyl ether.

12. The charge-transporting varnish according to claim 1, wherein said alcohols are one or more selected from the group consisting of ethanol, isopropanol, tert-butanol, allyl alcohol, n-propanol, 2-methyl-2-butanol, isobutanol, n-butanol, 2-methyl-1-butanol, 1-pentanol, 2-methyl-1-pentanol, 2-ethylhexanol, 1-octanol, ethylene glycol, hexylene glycol, trimethylene glycol, 1-methoxy-2-butanol, diacetone alcohol, furfuryl alcohol, tetrahydrofurfuryl alcohol, propylene glycol and benzyl alcohol.

13. The varnish according to claim 1, wherein a combination of said good solvent and poor solvent is 1,3-dimethyl-2-imidazolidinone and isobutanol, 1,3-dimethyl-2-imidazolidinone and cyclohexanol, or 1,3-dimethyl-2-imidazolidinone and propylene glycol monoethyl ether.

14. The varnish according to claim 1, wherein a combination of said good solvent and poor solvent is 1,3-dimethyl-2-imidazolidinone and isobutanol or 1,3-dimethyl-2-imidazolidinone and propylene glycol monoethyl ether.

* * * * *